(12) United States Patent
Song et al.

(10) Patent No.: US 11,996,398 B2
(45) Date of Patent: *May 28, 2024

(54) SEMICONDUCTOR PACKAGE AND METHOD OF MANUFACTURING THE SAME

(71) Applicant: SAMSUNG ELECTRONICS CO., LTD., Suwon-si (KR)

(72) Inventors: Eunseok Song, Hwaseong-si (KR); Kyungsuk Oh, Seongnam-si (KR); Seho You, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/048,825

(22) Filed: Oct. 21, 2022

(65) Prior Publication Data
US 2023/0057342 A1 Feb. 23, 2023

Related U.S. Application Data

(63) Continuation of application No. 17/002,979, filed on Aug. 26, 2020, now Pat. No. 11,482,516.

(30) Foreign Application Priority Data

Dec. 19, 2019 (KR) ........................ 10-2019-0171034

(51) Int. Cl.
*H01L 23/48* (2006.01)
*H01L 23/00* (2006.01)
(Continued)

(52) U.S. Cl.
CPC ............ *H01L 25/18* (2013.01); *H01L 23/481* (2013.01); *H01L 24/05* (2013.01); *H01L 24/29* (2013.01);
(Continued)

(58) Field of Classification Search
CPC ....... H01L 25/18; H01L 23/481; H01L 24/05; H01L 24/29; H01L 2224/05647;
(Continued)

(56) References Cited

U.S. PATENT DOCUMENTS 7,378,733 B1* 5/2008 Hoang .................. H01L 23/642
257/E23.178
7,459,772 B2 12/2008 Speers
(Continued)

FOREIGN PATENT DOCUMENTS

KR 10-2013-0036591 A 4/2013

OTHER PUBLICATIONS

Office Action issued in corresponding KR Patent Application No. 10-2019-0171034 dated Mar. 29, 2024.

*Primary Examiner* — Niki H Nguyen
(74) *Attorney, Agent, or Firm* — F. Chau & Associates, LLC

(57) ABSTRACT

A semiconductor package includes a package substrate, a logic chip stacked on the package substrate and including at least one logic element, and a stack structure. The stack structure includes an integrated voltage regulator (IVR) chip including a voltage regulating circuit that regulates a voltage of the at least one logic element, and a passive element chip stacked on the IVR chip and including an inductor.

20 Claims, 24 Drawing Sheets

(51) Int. Cl.
  *H01L 23/52*   (2006.01)
  *H01L 25/18*   (2023.01)
  *H01L 29/40*   (2006.01)

(52) U.S. Cl.
  CPC ............... *H01L 2224/05647* (2013.01); *H01L 2924/1427* (2013.01); *H01L 2924/1431* (2013.01)

(58) Field of Classification Search
  CPC ..... H01L 2924/1427; H01L 2924/1431; H01L 25/0657; H01L 2224/16227; H01L 23/645; H01L 2225/06541; H01L 24/97; H01L 28/10; H01L 2924/19042; H01L 25/0652; H01L 2224/16265; H01L 2224/16145; H01L 23/5226; H01L 2224/08145; H01L 2224/08267; H01L 2224/16; H01L 2224/48145; H01L 2224/73207; H01L 2224/73257; H01L 2225/1058; H01L 24/24; H01L 24/20; H01L 2224/16148; H01L 2224/16235; H01L 2224/16238; H01L 2224/24195; H01L 2225/06555; H01L 2924/19011; H01L 2924/19102; H01L 2924/19105; H01L 2225/107; H01L 23/5384
  See application file for complete search history.

(56) References Cited

U.S. PATENT DOCUMENTS

| | | | |
|---|---|---|---|
| 8,653,676 | B2 | 2/2014 | Kim et al. |
| 8,692,368 | B2 | 4/2014 | Pan et al. |
| 8,812,879 | B2 | 8/2014 | Wen et al. |
| 9,443,825 | B2 | 9/2016 | Lien et al. |
| 9,576,900 | B2 | 2/2017 | Dosluoglu |
| 10,163,851 | B2 | 12/2018 | Yu et al. |
| 10,403,600 | B2 | 9/2019 | Samra et al. |
| 11,482,516 | B2 * | 10/2022 | Song .................... H01L 25/18 |
| 2011/0050334 | A1 * | 3/2011 | Pan ....................... H02M 3/003 |
| | | | 327/540 |
| 2015/0054573 | A1 | 2/2015 | Zhou et al. |
| 2015/0294955 | A1 | 10/2015 | Chen et al. |
| 2016/0181211 | A1 | 6/2016 | Kamgaing et al. |
| 2019/0103153 | A1 | 4/2019 | Huang |
| 2021/0193640 | A1 | 6/2021 | Song et al. |

\* cited by examiner

SEMICONDUCTOR PACKAGE AND METHOD OF MANUFACTURING THE SAME

CROSS-REFERENCE TO RELATED APPLICATIONS

This application is a continuation application of U.S. Ser. No. 17/002,979, filed on Aug. 26, 2020, which claims the benefit of Korean Patent Application No. 10-2019-0171034, filed on Dec. 19, 2019 in the Korean Intellectual Property Office, the disclosure of which is incorporated by reference herein in its entirety.

TECHNICAL FIELD

Exemplary embodiments of the inventive concept relate to a semiconductor package and a method of manufacturing the semiconductor package, and more particularly, to a semiconductor package including a logic chip and an integrated voltage regulator (IVR) chip and a method of manufacturing the semiconductor package.

DISCUSSION OF THE RELATED ART

Voltage regulators are widely used to regulate voltages in electronic devices such as, for example, computers, servers, and smartphones. In such electronic devices, and in similar electronic devices, demand such as a regulated voltage level, current draw, etc. may variously change. Typically, specific voltage regulators are designed for small systems based on the input current requirements of the systems. Since it is difficult and/or expensive to manufacture such a voltage regulator in a semiconductor chip, the voltage regulator is generally manufactured separately and used on a system board. An inductor is utilized for the operation of a voltage regulator. Since the inductor has a large size, an arrangement relationship between the voltage regulator and the inductor is a factor in improving the operation characteristics of the voltage regulator.

SUMMARY

Exemplary embodiments of the inventive concept provide a semiconductor package that includes an integrated voltage regulator (IVR) chip with a voltage regulator (VR) and a logic chip including logic elements, improves the operating characteristics of the IVR chip, and minimizes or reduces the package size.

According to an exemplary embodiment, a semiconductor package includes a package substrate, a logic chip stacked on the package substrate and including at least one logic element, and a stack structure. The stack structure includes an integrated voltage regulator (IVR) chip including a voltage regulating circuit that regulates a voltage of the at least one logic element, and a passive element chip stacked on the IVR chip and including an inductor.

According to an exemplary embodiment, a semiconductor package includes a package substrate, a logic chip mounted on the package substrate and including at least one logic element, a first integrated voltage regulator (IVR) chip stacked on the logic chip and including a voltage regulating circuit that adjusts a voltage of the at least one logic element, and a first passive element chip stacked on the first IVR chip and including an inductor. The first passive element chip is stacked on the first IVR chip in a front-to-front bonding form in which an active surface of the first passive element chip and an active surface of the first IVR chip face each other. A pitch between pads of the first passive element chip or the first IVR chip is about 10 um or less.

According to an exemplary embodiment, a method of manufacturing a semiconductor package includes forming a plurality of voltage regulators (VR) on a first wafer, and forming a plurality of passive elements on a second wafer. Each of the passive elements includes an inductor. The method further includes forming a plurality of logic elements on a third wafer, forming a stack wafer by stacking the second wafer on the first wafer in a front-to-front bonding form in which an active surface of the first wafer and an active surface of the second wafer face each other, forming a first stack structure including an integrated voltage regulator (IVR) chip in a lower portion of the first stack structure and a passive element chip in an upper portion of the first stack structure by sawing the stack wafer, stacking the first stack structure on the third wafer, forming a second stack structure including a logic chip in a lower portion of the second stack structure and the first stack structure in an upper portion of the second stack structure by sawing the third wafer, and stacking the second stack structure on a package substrate.

According to an exemplary embodiment, a method of manufacturing a semiconductor package includes forming a plurality of voltage regulators (VR) on a first wafer, forming a plurality of passive elements on a second wafer, in which each of the passive elements includes an inductor, forming a plurality of logic elements on a third wafer, forming a first stack wafer by stacking the second wafer on the first wafer, forming a second stack wafer by stacking the first stack wafer on the third wafer, forming a stack structure in which a logic chip, an integrated voltage regulator (IVR) chip, and a passive element chip are sequentially stacked from a lower portion by sawing the second stack wafer, and stacking the stack structure on a package substrate.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION OF THE EXEMPLARY EMBODIMENTS

Figure 1:
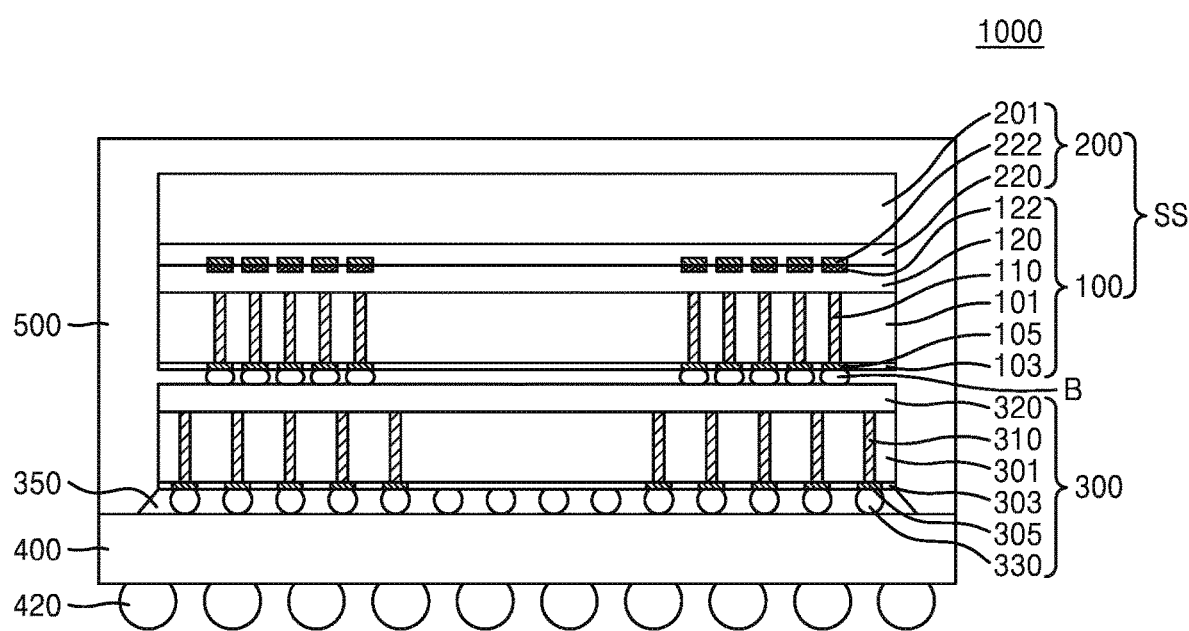
FIG. 1 is a cross-sectional view of a semiconductor package according to an exemplary embodiment.

Exemplary embodiments of the inventive concept will be described more fully hereinafter with reference to the accompanying drawings. Like reference numerals may refer to like elements throughout the accompanying drawings, and redundant descriptions thereof may be omitted.

Figure 2:
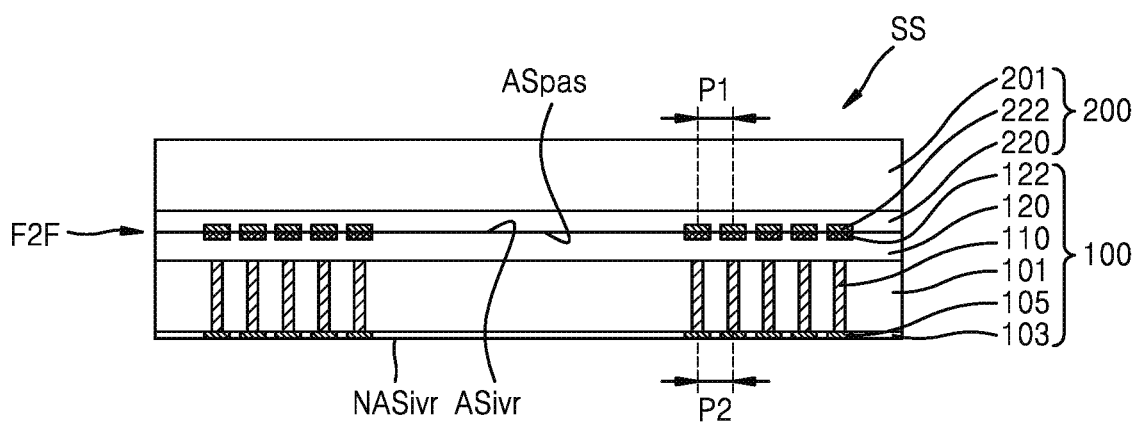
FIG. 2 is a cross-sectional view showing a stack structure including an integrated voltage regulator (IVR) chip and a passive element chip in the semiconductor package of FIG. 1.

FIG. 1 is a cross-sectional view of a semiconductor package 1000 according to an exemplary embodiment. FIG. 2 is a cross-sectional view showing a stack structure SS including an integrated voltage regulator (IVR) chip 100 and a passive element chip 200 in the semiconductor package 1000 of FIG. 1. The term 'chip' may refer to a semiconductor chip.

Referring to FIGS. 1 and 2, the semiconductor package 1000 according to an exemplary embodiment may include a logic chip 300, the stack structure SS, a package substrate 400, and a sealing material 500.

As shown in FIG. 1, in an exemplary embodiment, the stack structure SS may be stacked on the package substrate 400 in a configuration in which the stack structure SS, the logic chip 300, and the package substrate 400 overlap one another in a cross-sectional view. For example, the stack structure SS may be stacked on the package substrate 400 adjacent to the logic chip 300, with the logic chip 300 disposed between the stack structure SS and the package substrate 400. For example, in an exemplary embodiment, the stack structure SS, the logic chip 300, and the package substrate 400 may be aligned with one another in a cross-sectional view.

The logic chip 300 may be mounted on the package substrate 400 through a connection member 330 and an underfill 350. The underfill 350 may fill an area between the logic chip 300 and the package substrate 400. According to an exemplary embodiment, when the sealing material 500 is formed through a process such as molded underfill (MUF), the underfill 350 may be omitted. Further, according to an exemplary embodiment, the underfill 350 may be replaced with an adhesive film.

The logic chip 300 may include a plurality of logic elements therein. A logic element may refer to an element that performs various signal processing including, for example, logic circuits such as an AND gate, an OR gate, a NOT gate, and a flip-flop. For example, the logic element may be an element that performs signal processing such as analog signal processing, analog-to-digital (A/D) conversion, and control. A logic element may also be referred to herein as a logic circuit element. The logic chip 300 may be referred to as, for example, a control chip, a process chip, a CPU chip, etc. according to its function.

The logic chip 300 may include a body 301, a through-electrode 310, and a wiring layer 320. The body 301 may include a semiconductor substrate, an integrated circuit layer, and an interlayer insulating film. The semiconductor substrate may refer to a silicon substrate. The integrated circuit layer may include the logic circuit described above. The wiring layer 320 may include an insulating layer and multilayer wirings in the insulating layer.

The through-electrode 310 may also be referred to as a through-silicon via (TSV) because the through-electrode 310 has a structure in which the through-electrode 310 penetrates a silicon portion constituting the body 301 of the logic chip 300. For example, in the semiconductor package 1000 of an exemplary embodiment, the through-electrode 310 may be formed in a via-middle structure. However, the inventive concept is not limited thereto. For example, in an exemplary embodiment, the through-electrode 310 may also be formed in a via-first or via-last structure. The via-first structure refers to a structure in which a through-electrode is formed before an integrated circuit layer is formed, the via-middle structure refers to a structure in which the through-electrode is formed before a wiring layer is formed after the integrated circuit layer is formed, and the via-last structure refers to a structure in which the through-electrode is formed after the wiring layer is formed. In the semiconductor package 1000 of an exemplary embodiment, the through-electrode 310 may result from the via-middle structure and extend through the body 301 to the wiring layer 320.

The through-electrode 310 may be connected to a lower pad 305 on the lower surface, and may be connected to a chip pad (see 322 in FIG. 3A) on the upper surface. In an exemplary embodiment, the through-electrode 310 may be connected to the chip pad through a wiring layer. In an exemplary embodiment, the through-electrode 310 may be directly connected to the chip pad.

A lower protection layer 303 and the lower pad 305 may be disposed on the lower surface of the logic chip 300. The lower pad 305 has a structure in which the lower pad 305 is connected to the through-electrode 310, may be disposed on the lower surface of the logic chip 300, and may be exposed from the lower protection layer 303. The connection member 330 may be disposed on the lower pad 305. The through-electrode 310 may be connected to the connection member 330 through the lower pad 305.

The connection member 330 may include a conductive material such as, for example, copper (Cu), aluminum (Al), silver (Ag), tin (Tin), gold (Au), solder, etc. However, the material of the connection member 330 is not limited thereto. The connection member 330 may be formed as multiple layers or a single layer. For example, when the connection member 330 is formed as multiple layers, the connection member 330 may include copper pillars and solder. When the connection member 330 is formed as the single layer, the connection member 330 may include tin-silver solder or copper. The connection member 330 is commonly referred to as a bump, and a process of attaching the bump to chips in a wafer state is called a bumping process.

The stack structure SS may be stacked on the logic chip 300 through a bonding member B. A structure in which the stack structure SS is bonded and stacked on the logic chip 300 through the bonding member B may vary. For example, according to the shape or material of the bonding member B, the bonding and stacked structure between the stack structure SS and the logic chip 300 may be different. The structure in which the stack structure SS is stacked through the bonding member B on the logic chip 300 will be described in more detail with reference to FIGS. 3A to 3C.

The stack structure SS may include the IVR chip 100 in the lower portion thereof and the passive element chip 200 in the upper portion thereof, as shown in FIG. 2.

The IVR chip 100 may include a circuit for regulating voltage therein, that is, a voltage regulator (VR). The VR may also be referred to as a voltage regulating circuit. The VR may include a control circuit and a switching logic circuit. The control circuit may include a number of transistors for voltage regulation, and the switch logic circuit may include at least two transistors for selecting a current path. The switch logic circuit may be connected to passive elements such as, for example, an inductor and a capacitor, disposed on the passive element chip 200. That is, the passive element chip 200 may include a passive element, and the passive element may be, for example, an inductor or a capacitor. The passive element may also be referred to herein as a passive circuit element. For example, the control circuits, the switching logic circuit, the inductor, and the capacitor may be configured to function as buck regulators. The voltage regulating circuit may regulate a voltage(s) of the logic element(s) of the logic chip 300.

In the semiconductor package 1000 of an exemplary embodiment, the IVR chip 100 may be implemented as a semiconductor chip based on a silicon wafer. In addition, the IVR chip 100 may be implemented in a structure in which the control circuit and the switching logic circuit are integrated in one semiconductor chip. The IVR chip 100 may be manufactured in a compact structure through a semiconductor process based on a silicon wafer.

For example, the IVR chip 100 may include a body 101, a through-electrode 110, and a wiring layer 120. The body 101 may include a semiconductor substrate, an integrated circuit layer, and an interlayer insulating film. The semiconductor substrate may refer to a silicon substrate. In addition, the integrated circuit layer may include the control circuit and the switching logic circuit described above. The wiring layer 120 may include an insulating layer and multilayer wirings in the insulating layer.

The through-electrode 110 may penetrate the body 101 and be connected to the wiring layer 120. According to an exemplary embodiment, the through-electrode 110 may be formed to have a structure in which the through-electrode 110 penetrates the wiring layer 120. Since the through-electrode 110 penetrates the body 101 of silicon, the through-electrode 110 may also be referred to as a TSV. The control circuit and the switch logic circuit of the IVR chip 100 may be connected to the passive elements of the passive element chip 200 through the through-electrode 110 and/or the wiring layer 120, and may also be connected to the logic elements of the logic chip 300 through the through-electrode 110.

As shown in FIG. 2, a lower pad 105 may be disposed on the lower surface of the IVR chip 100, and a chip pad 122 may be disposed on the upper surface of the IVR chip 100. The lower pad 105 may be connected to the through-electrode 110 and may be exposed from a protection layer 103 formed on the lower surface of the IVR chip 100. The chip pad 122 may be connected to the through-electrode 110 through wires in the wiring layer 120.

The passive element chip 200 may include a plurality of passive elements therein. Passive elements may include, for example, inductors and capacitors. The passive element chip 200 may also be implemented as a semiconductor chip based on a silicon wafer. For example, the passive element chip 200 may be implemented in a structure in which passive elements such as, for example, an inductor and a capacitor are integrated in one semiconductor chip.

The passive element chip 200 may include a body 201 and a wiring layer 220. Passive elements may be disposed on the body 201. The wiring layer 220 may include an insulating layer and multilayer wirings in the insulating layer. A chip pad 222 may be disposed on the lower surface of the wiring layer 220. Passive elements may be connected to the chip pad 222 through wirings of the wiring layer 220.

In the semiconductor package 1000 of an exemplary embodiment, the stack structure SS may have a structure in which the passive element chip 200 is stacked on the IVR chip 100 in a front-to-front bonding form. The front-to-front bonding form may mean a form in which two chips or two wafers are bonded such that active surfaces face each other. The front surface refers to an active surface, and the active surface refers to a surface on which elements are formed in a wafer state, and may be a surface on which a chip pad is formed.

In the figures, elements stacked in a front-to-back bonding form may be indicated by 'F2B', and elements stacked in a front-to-front bonding form may be indicated by 'F2F'. In addition, in the figures, ASivr may indicate an active surface of the IVR chip 100, NASivr may indicate an inactive surface of the IVR chip 100, and ASpas may indicate an active surface of the passive element chip 200.

In the stack structure SS, as the passive element chip 200 is stacked on the IVR chip 100 in the front-to-front bonding form. Front-to-front bonding may be implemented using pad-to-pad bonding, in which the chip pads 122 of the IVR chip 100 make one-to-one contact with the corresponding chip pads 222 of the passive element chip 200. That is, the chip pads 122 of the IVR chip 100 may be formed in one-to-one correspondence with the chip pads 222. In this case, the chip pads 122 and the chip pads 222 may be copper pads. The passive element chip 200 may be stacked on the IVR chip 100 in the front-to-front bonding form such that the active surface ASpas of the passive element chip 200 faces the active surface ASivr of the IVR chip 100. The chip pads 122, 222 may include copper (Cu), and accordingly, pad-to-pad bonding in which the chip pads 122, 222 directly contact each other may also be referred to as Cu-to-Cu bonding.

In the semiconductor package 1000 of an exemplary embodiment, the type of bonding of the stack structure SS is not limited to pad-to-pad bonding. For example, the stack structure SS may have a stack structure of bonding using an anisotropic conductive film (ACF) rather than pad-to-pad bonding. That is, the front-to-front bonding may be implemented using an ACF. The ACF refers to an anisotropic conductive film in which fine conductive particles are mixed with an adhesive resin to form a film, and electricity is applied in only one direction. One direction may mean directions facing each other between two chip pads to be connected. For example, nickel (Ni), carbon, solder, etc. may be used as the fine conductive particles. Even when the passive element chip 200 is stacked on the IVR chip 100 through bonding using the ACF, since the chip pad 122 of the IVR chip 100 faces the chip pad 222 of the passive element chip 200, it may correspond to the front-to-front bonding form.

Front-to-front bonding may be performed at the wafer level. As described above, a technology in which front-to-front bonding is performed at the wafer level, or a structure corresponding thereto, is referred to as a wafer-on-wafer (WoW) technology or a WoW structure (hereinafter collectively referred to as a 'WoW structure'). When a chip or wafer is stacked in the WoW structure through front-to-front bonding, the pitch of the chip pads used for bonding may be very small. For example, the chip pads 122 of the IVR chip 100 or the chip pads 222 of the passive element chip 200 may have a first pitch P1, and the first pitch P1 may be, for example, about 10 urn or less. However, the first pitch P1 is not limited to the above value.

The through-electrodes 110 or the lower pads 105 of the IVR chip 100 may have a second pitch P2, and the second pitch P2 may be different according to which bonding form is used to stack the stack structure SS on the logic chip 300 thereunder. The bonding form in which the stack structure SS is stacked on the logic chip 300 may be different according to the second pitch P2.

For example, when the stack structure SS is stacked on the logic chip 300 in a die-to-wafer (D2 W) technology or structure (hereinafter referred to as a 'D2 W structure'), the second pitch P2 may be similar to the first pitch P1. For example, the second pitch P2 may be about 5 um to about 10 um. The second pitch P2 in the D2 W structure is not limited to the above values. When the stack structure SS is stacked on the logic chip 300 in a chip on wafer (CoW) technology or structure (hereinafter, referred to as a 'CoW structure'), the second pitch P2 may be greater than the first pitch P1. For example, the second pitch P2 may be about 50 um or less. In an exemplary embodiment, the second pitch P2 may be about 30 um. The second pitch P2 in the CoW structure is not limited to the above values. The D2 W structure may mean a structure in which chips are stacked on a wafer but stacked through bonding between chip pads, such as pad-to-pad bonding or bonding using ACF, and the CoW structure may mean a structure in which chips are stacked on a wafer but stacked through bonding using a connection member such as a bump or a solder ball. In the case of bonding using the connection member, a sufficient distance may be secured between adjacent pads to prevent short circuit defects due to reflow during the bonding process.

The package substrate 400 is a support substrate on which the logic chip 300 and the stack structure SS are mounted, and may include at least one wiring layer therein. When the wiring is formed as multiple layers, different wiring layers may be connected to each other through a vertical contact. According to an exemplary embodiment, the package substrate 400 may include a through-electrode that directly connects pads on the upper and lower surfaces. However, since the package substrate 400 is not usually formed of a silicon wafer, the through-electrode may not correspond to a TSV. Protection layers such as solder resist may be formed on the upper and lower surfaces of the package substrate 400. Pads may be connected to the wirings of the wiring layer and exposed from the protection layer. The package substrate 400 may be formed based on, for example, a ceramic substrate, a printed circuit board (PCB), an organic substrate, or an interposer substrate. According to an exemplary embodiment, the package substrate 400 may be formed of an active wafer, such as a silicon wafer.

As illustrated in FIG. 1, an external connection member 420 such as, for example, a bump or a solder ball may be disposed on the lower surface of the package substrate 400. The external connection member 420 may serve the function of mounting the semiconductor package 1000 on an external system board or a main board. The external connection member 420 may be larger than the connection member 330 of the logic chip 300. Also, the pitch of the external connection member 420 may be greater than the pitch of the connection member 330 of the logic chip 300. The material or structure of the external connection member 420 is the same as described above with respect to the connection member 330 of the logic chip 300.

The sealing material 500 may cover and seal the logic chip 300, the stack structure SS, and the underfill 350 on the package substrate 400. The sealing material 500 may seal and protect the logic chip 300 and the stack structure SS from external physical and chemical damage. The sealing material 500 may be formed of, for example, an epoxy-based material, a thermosetting material, a thermoplastic material, or a UV curable material. In addition, the sealing material 500 may be formed of a resin and may include a filler. The sealing material 500 may be formed through an MUF process, in which case, the underfill 350 may be omitted.

As illustrated in FIG. 1, the sealing material 500 may have a structure that covers the upper surface of the stack structure SS. However, the inventive concept is not limited thereto. For example, in an exemplary embodiment, the sealing material 500 may have a structure that does not cover the upper surface of the stack structure SS. That is, the upper surface of the stack structure SS may be exposed from the sealing material 500.

The semiconductor package 1000 of an exemplary embodiment may have a structure in which the stack structure SS is stacked on the logic chip 300, and the stack structure SS may have a structure in which the passive element chip 200 is stacked on the IVR chip 100. The structure of the stack structure SS may minimize or reduce resistance by minimizing or reducing a path between a voltage regulator of the IVR chip 100 and a passive element in the passive element chip 200, such as an inductor, to minimize or reduce resistance, thereby improving the operation characteristics of the IVR chip 100. In addition, since the stack structure SS including the IVR chip 100 is directly stacked on the logic chip 300, the operating characteristics of the logic chip 300 may be improved, and the size of the package may be minimized or reduced.

Referring to a comparative example, the voltage regulator and the inductor are typically manufactured together as one chip. However, in this case, since the area occupied by the inductor is large, this approach does not result in reducing the size of the chip. In addition, in a case in which the voltage regulator is separately disposed on the system board, a path to a logic chip or an inductor increases, which may cause the operating characteristics of the voltage regulator and the logic chip to deteriorate. Further, when the voltage regulator and the passive element such as the inductor are separately disposed on a package substrate, the size of the package may increase. However, in the semiconductor package 1000 according to an exemplary embodiment, the stack structure SS is formed in a structure in which the passive element chip 200 is stacked on the IVR chip 100, and the stack structure SS is stacked on the logic chip 300. As a result, the above-described problems may be solved according to exemplary embodiments of the inventive concept.

Figure 3A:
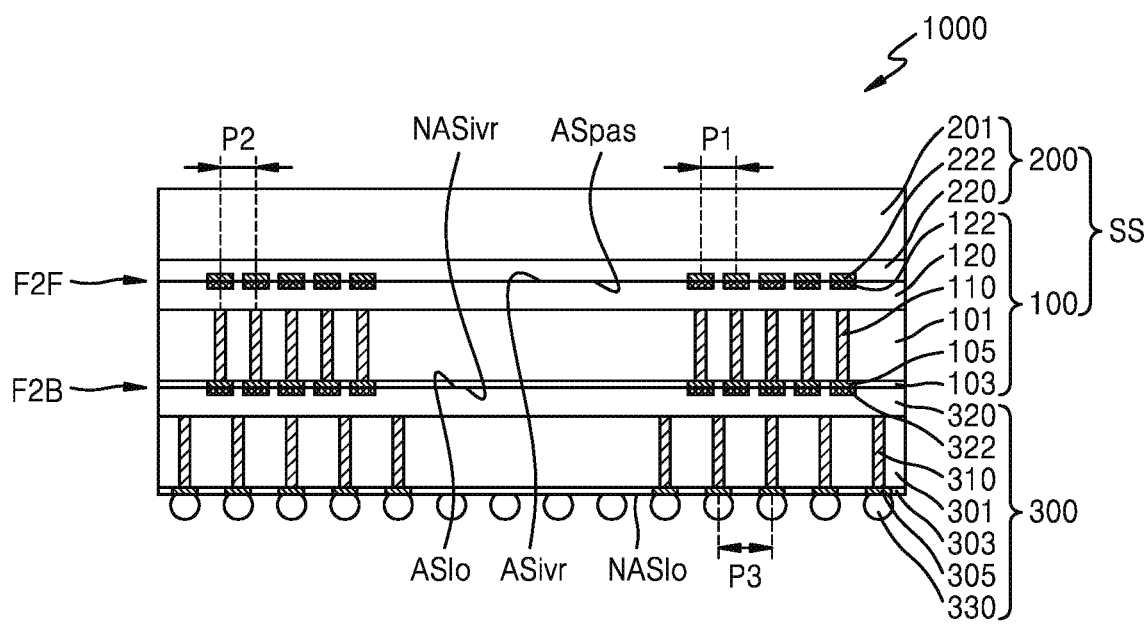
FIGS. 3A to 3C are cross-sectional views illustrating structures in which a stack structure is stacked on a logic chip in various bonding forms in the semiconductor package of FIG. 1 according to exemplary embodiments.
Figure 3B:
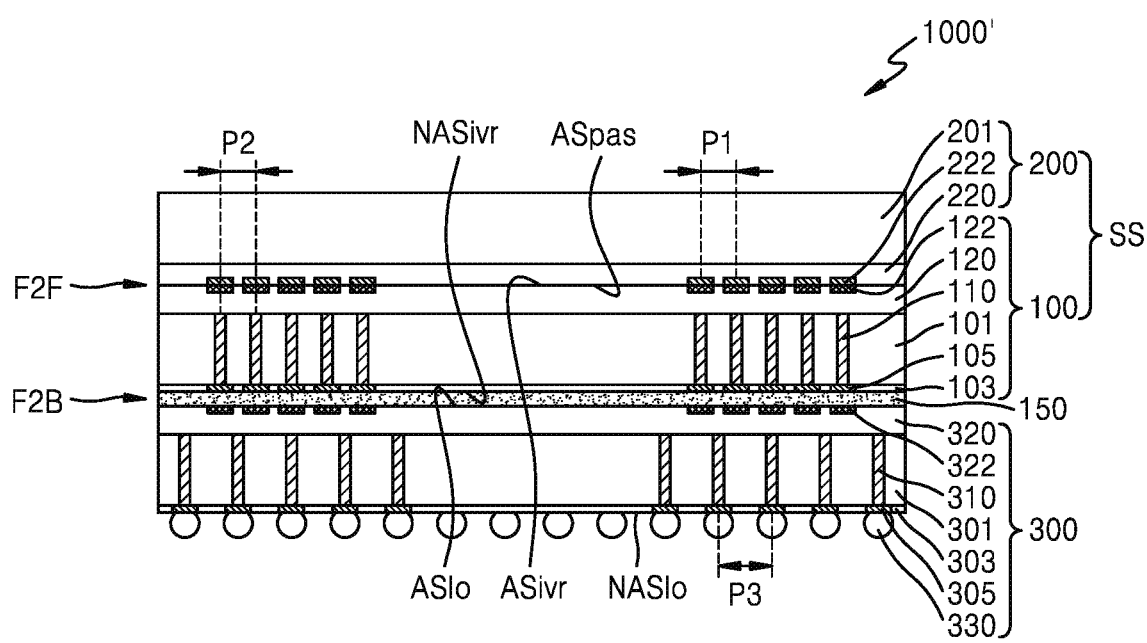
Figure 3C:
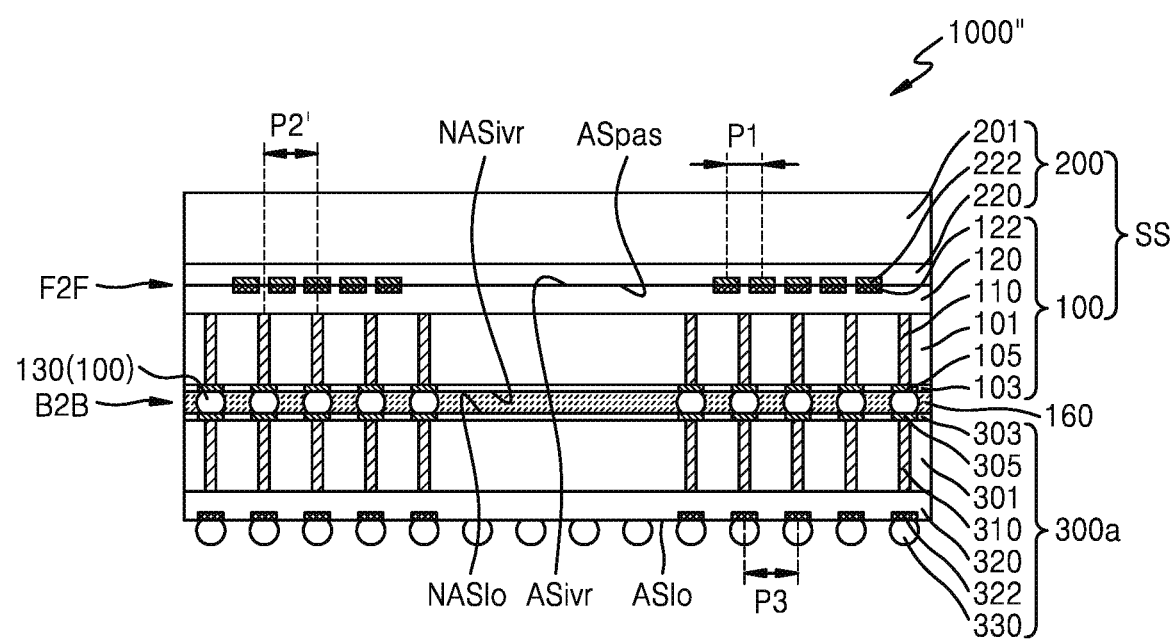

FIGS. 3A to 3C are cross-sectional views illustrating structures in which the stack structure SS is stacked on the logic chip 300 in various bonding forms in the semiconductor package 1000 of FIG. 1 according to exemplary embodiments. For convenience of explanation, a further description of elements and technical aspects previously described may be only briefly provided or omitted.

Referring to FIG. 3A, in the semiconductor package 1000 of an exemplary embodiment, the stack structure SS may be stacked on the logic chip 300 in a front-to-back bonding form. The back surface means an inactive surface, and the opposite surface of an active surface. Therefore, the front-to-back bonding form may refer to a form in which two chips or two wafers are bonded such that the active surface and the inactive surface face each other. For example, the stack structure SS may be bonded and stacked on the logic chip 300 in a form in which an active surface ASlo of the logic chip 300 and an inactive surface NASivr of the IVR chip 100 face each other. Accordingly, in the semiconductor package 1000 of an exemplary embodiment, the logic chip 300 may have an upper side as the active surface ASlo and a lower side as the inactive surface NASlo (in which NASlo indicates the inactive surface of the logic chip 300). In addition, the IVR chip 100 of the lower portion of the stack structure SS may have an upper side as the active surface ASivr (in which ASivr indicates the active surface of the IVR chip 100) and a lower side as the inactive surface NASivr.

In the semiconductor package 1000 of an exemplary embodiment, the stack structure SS may be stacked on the logic chip 300 through pad-to-pad bonding in which the chip pad 322 of the logic chip 300 and the lower pad 105 of the IVR chip 100 directly contact each other. In addition, a stacked structure of the stack structure SS on the logic chip 300 through pad-to-pad bonding may result from a WoW structure or a D2 W structure.

As described above, the chip pads 122 of the IVR chip 100 of the stack structure SS and the chip pads 222 of the passive element chip 200 contacting the chip pads 122 have the first pitch P1. In addition, the through-electrodes 110 of the IVR chip 100, the lower pads 105 connected to the through-electrodes 110, and the chip pads 322 of the logic chip 300 contacting the lower pads 105 through pad-to-pad bonding may have the second pitch P2. The second pitch P2 may be similar to the first pitch P1. For example, the second pitch P2 may be about 10 um or less. In an exemplary embodiment, the second pitch P2 may be about 5 um. In an exemplary embodiment, the second pitch P2 may be about 10 um.

The through-electrode 310 of the logic chip 300 and the lower pads 305 connected thereto may have a third pitch P3. Considering that the logic chip 300 is stacked on the package substrate 400 through the connection member 330, the third pitch P3 may be similar to or greater than the pitch of pads in a CoW structure. For example, the third pitch P3 may be about 50 um or larger. However, the third pitch P3 is not limited to the above value.

Referring to FIG. 3B, in a semiconductor package 1000' of an exemplary embodiment, the stack structure SS may be stacked on the logic chip 300 in the front-to-back bonding form. For example, similar to the semiconductor package 1000 of FIG. 3A, the stack structure SS may be bonded and stacked on the logic chip 300 such that the active surface ASlo of the logic chip 300 and the inactive surface NASivr of the IVR chip 100 face each other. Accordingly, the logic chip 300 may have an upper side as the active surface ASlo and a lower side as the inactive surface NASlo, and the IVR chip 100 of the stack structure SS may have an upper side as the active surface ASivr and a lower side as the inactive surface NASivr.

However, in the semiconductor package 1000', the stack structure SS may be stacked on the logic chip 300 through bonding using the ACF 150 rather than pad-to-pad bonding. The stacked structure of the logic chip 300 and the stack structure SS through bonding using the ACF 150 may result from a WoW structure or a D2 W structure.

The chip pads 122 of the IVR chip 100 and the chip pads 222 of the passive element chip in the stack structure SS may have the first pitch P1. Further, the through-electrodes 110 of the IVR chip 100, the lower pads 105 connected thereto, and the chip pads 322 of the logic chip 300 corresponding to the lower pads 105 through bonding using the ACF 150 may have the second pitch P2. Further, the through-electrodes 310 of the logic chip 300 and the lower pads 305 connected thereto may have the third pitch P3. The sizes of the first pitch P1, the second pitch P2, and the third pitch P3 are the same as described above with respect to the semiconductor package 1000 of FIG. 3A.

Referring to FIG. 3C, in a semiconductor package 1000" of an exemplary embodiment, the stack structure SS may be stacked on a logic chip 300a in a back-to-back bonding form. The back-to-back bonding form may refer to a form in which two chips or two wafers are bonded so that inactive surfaces face each other.

For example, the stack structure SS may be bonded and stacked on the logic chip 300a in a form in which the inactive surface NASlo of the logic chip 300a and the inactive surface NASivr of the IVR chip 100 face each other. Accordingly, in the semiconductor package 1000", the logic chip 300a may have an upper side as the inactive surface NASlo and a lower side as the active surface ASlo. In the case of the stack structure SS, in the same way as in the semiconductor package 1000 of FIG. 3A, the IVR chip 100 may have an upper side as the active surface ASivr and a lower side as the inactive surface NASivr. The semiconductor package 1000" may be considered as one where the logic chip 300a is turned upside down and the upper and lower surfaces thereof are changed as compared to the semiconductor packages 1000 and 1000' of FIGS. 3A and 3B.

In the semiconductor package 1000", the stack structure SS may be stacked on the logic chip 300a through bonding using a connection member 130. The connection member 130 is the same as described with respect to the connection member 330 of the logic chip 300 in the semiconductor package 1000 of FIG. 1. The stacked structure of the logic chip 300a and the stack structure SS through bonding using the connection member 130 may result from a CoW structure. In the case of bonding using the connection member 130, an adhesive film 160 may be disposed between the IVR chip 100 and the logic chip 300a.

In the semiconductor package 1000", the chip pads 122 of the IVR chip 100 and the chip pads 222 of the passive element chip 200 contacting the chip pads 122 of the stack structure SS may have the first pitch P1. In addition, the through-electrodes 110 of the IVR chip 100 and the lower pads 105 connected thereto, and the lower pads 305 of the logic chip 300a connected to the lower pads 105 through bonding using the connection member 330 and the through-electrodes 310 connected thereto may have a second pitch P2'. However, the second pitch P2' may be, for example, about 50 um or less. In an exemplary embodiment, the second pitch P2' may be about 30 um, based on the CoW structure. However, the second pitch P2' is not limited to the above values.

The chip pads 322 of the logic chip 300a may have the third pitch P3. The third pitch P3 is the same as described above with respect to the third pitch P3 in the semiconductor package 1000 of FIG. 3A. That is, considering that the logic chip 300a is stacked on the package substrate 400 through the connection member 330, the third pitch P3 may be similar to or greater than the pitch of pads in the CoW structure. For example, the third pitch P3 may be about 50 um or larger. However, the third pitch P3 is not limited to the above value. In addition, considering that the second pitch P2' also results from the CoW structure, as shown in FIG. 3C, the third pitch P3 may be substantially the same as the second pitch P2'. However, the inventive concept is not limited thereto. For example, according to an exemplary embodiment, the third pitch P3 may be greater than the second pitch P2'.

In addition, in FIG. 3C, although the structure in which the stack structure SS is stacked on the inactive surface NASlo of the logic chip 300a through bonding using the connection member 130 is illustrated, the stacked structure of the semiconductor package 1000" is not limited thereto. For example, in the semiconductor package 1000" of an exemplary embodiment, the stack structure SS may be stacked on the active surface ASlo of the logic chip 300a through bonding using the connection member 130.

Figure 4:
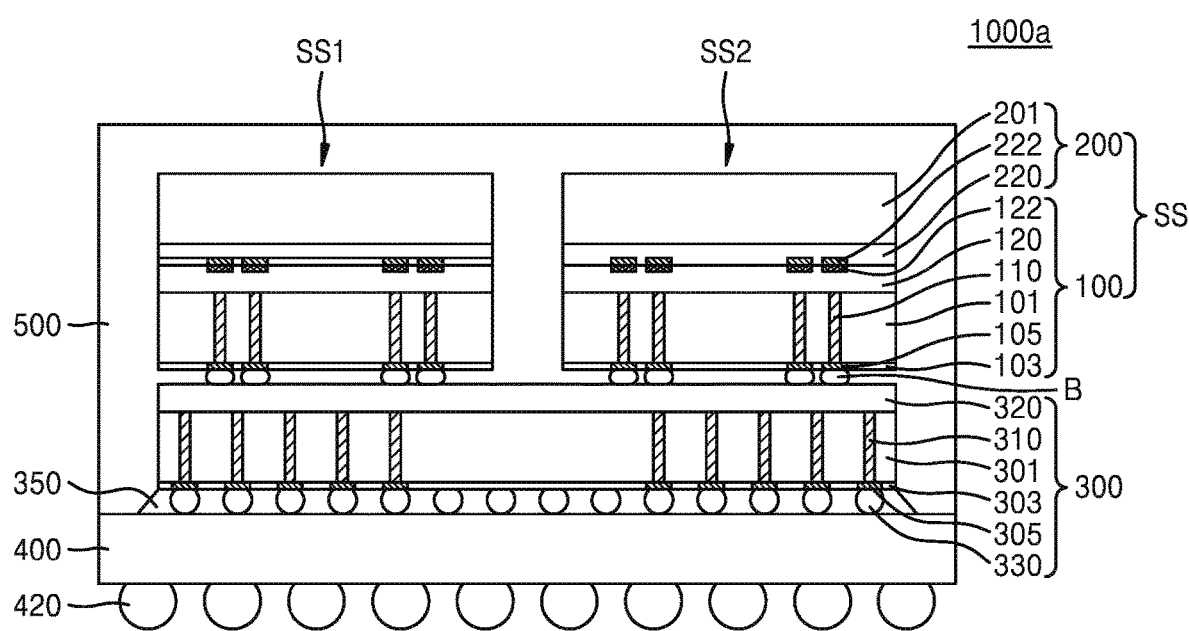
FIGS. 4 and 5 are cross-sectional views of semiconductor packages according to exemplary embodiments.
Figure 5:
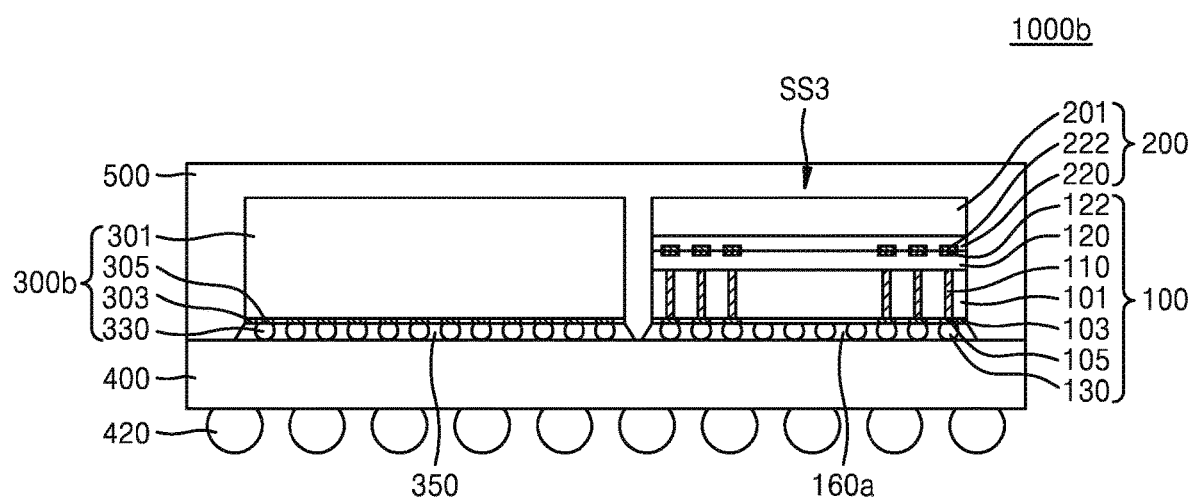

FIGS. 4 and 5 are cross-sectional views of semiconductor packages 1000a and 1000b, respectively, according to exemplary embodiments. For convenience of explanation, a further description of elements and technical aspects previously described may be only briefly provided or omitted.

Referring to FIG. 4, the semiconductor package 1000a of an exemplary embodiment may be different from the semiconductor package 1000 of FIG. 1 in that two stack structures SS1 and SS2 are stacked on the logic chip 300. For example, in the semiconductor package 1000a, the first stack structure SS1 may be stacked on the upper left side of the logic chip 300 and the second stack structure SS2 may be stacked on the upper right side of the logic chip 300. Thus, the first stack structure SS1 and the second stack structure SS2 may be stacked on the logic chip 300 adjacent to each other in a cross-sectional view.

Each of the stack structures SS1 and SS2 may include the same elements and have the same configuration as the stack structure SS described above. Thus, in an exemplary embodiment a first IVR chip 100 may be stacked on the logic chip 300, and a second IVR chip 100 may be stacked on the logic chip 300. Further, a first passive element chip 200 may be stacked on the first IVR chip 100, and a second passive element chip 200 may be stacked on the second IVR chip 100.

The first stack structure SS1 and the second stack structure SS2 may be stacked on the logic chip 300 in various bonding forms. For example, the first stack structure SS1 and the second stack structure SS2 may be stacked on the logic chip 300 in a front-to-back bonding form or a back-to-back bonding form. In addition, the stacked structure of the first stack structure SS1 and the second stack structure SS2 onto the logic chip 300 through such front-to-back bonding or back-to-back bonding may result from a D2W or CoW structure. However, since the two stack structures SS1 and SS2 are stacked on the one logic chip 300, a WoW structure in which a wafer is stacked on a wafer may be excluded.

In FIG. 4, a structure in which the two stack structures SS1 and SS2 are stacked on the one logic chip 300 is illustrated. However, the structure of the semiconductor package 1000a is not limited thereto. For example, in an exemplary embodiment, the semiconductor package 1000a may include a structure in which three or more stack structures are stacked on the logic chip 300.

The logic chip 300 may include at least one logic element therein. In exemplary embodiments, the logic chip 300 may include a plurality of logic elements therein. Also, the logic elements may use at least two different voltages. For example, different logic elements may use different voltages to function properly. In such a case, stacked structures each having an IVR chip capable of adjusting the corresponding voltage and a passive element chip with respect to the IVR chip are arranged on the logic chip 300, and thus, the operating characteristics of the logic chip 300 may be optimized or improved. In addition, as illustrated in FIG. 4, when all of the stack structures SS1 and SS2 are disposed within the upper surface of the logic chip 300, the total size of the semiconductor package 1000a may be substantially the same as the size of the semiconductor package 1000 of FIG. 1.

Referring to FIG. 5, the semiconductor package 1000b of an exemplary embodiment may be different from the semiconductor packages 1000, 1000', 1000", and 1000a previously described in that a stack structure SS3 is not stacked on the logic chip 300. For example, in the semiconductor package 1000b, the stack structure SS3 may be directly stacked on the package substrate 400 through the connection member 130. The structure of the stack structure SS3 may be substantially the same as the stack structure SS described with reference to FIG. 2. However, in terms of the size, the stack structure SS3 may be smaller than the stack structure SS included in the semiconductor package 1000 of FIG. 1. Also, according to an exemplary embodiment, the stack structure SS3 may have a size similar to the stack structures SS1 and SS2 of the semiconductor package 1000a of FIG. 4.

The stack structure SS3 may be stacked on the package substrate 400 through the connection member 130, and an underfill 160a may fill the area between the stack structure SS3 and the package substrate 400. When the sealing material 500 is formed through an MUF process, the underfill 160a may be omitted. Since the stack structure SS3 is stacked through the connection member 130, the pitch of the through-electrodes 110 and the lower pads 105 may be similar to that of pads of a CoW structure.

A voltage regulator of the IVR chip 100 of the stack structure SS3 may be connected to logic elements of the logic chip 300b through wirings in the package substrate 400. In an exemplary embodiment, since the stack structure SS3 is not stacked on the upper portion of the logic chip 300b, a direct connection of the IVR chip 100 and the logic chip 300b through a through-electrode is not implemented, and thus, the logic chip 300b does not include the through-electrode.

Since the semiconductor package 1000b includes the stack structure SS3 in which the passive element chip 200 is stacked on the IVR chip 100, the operating characteristics of the IVR chip 100 may be improved. In addition, when the size of the package substrate 400 is constant, the size of the logic chip 300b is reduced, and the stack structure SS3 is disposed on the remaining portion of the package substrate 400, and thus, the total height of the semiconductor package 1000b may be reduced. Moreover, since the logic chip 300b may be formed without forming a through-electrode, efficiency of manufacturing the logic chip 300b may be improved, which increases the yield, and accordingly, the mass production of the semiconductor package 1000b may increase.

Figure 6:
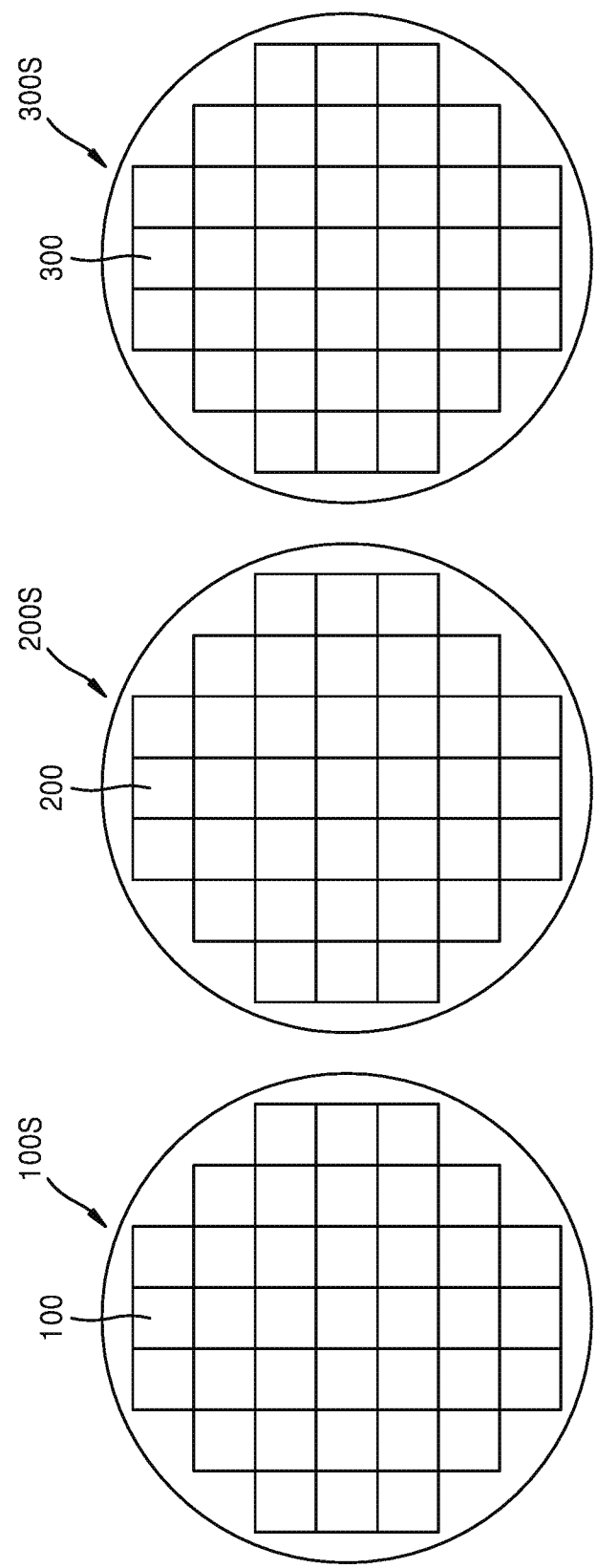
FIGS. 6, 7A-7C, 8A-8B, 9 and 10 are plan views, a perspective view, and cross-sectional views schematically showing a process of a method of manufacturing a semiconductor package of FIG. 1 according to exemplary embodiments.
Figure 7A:
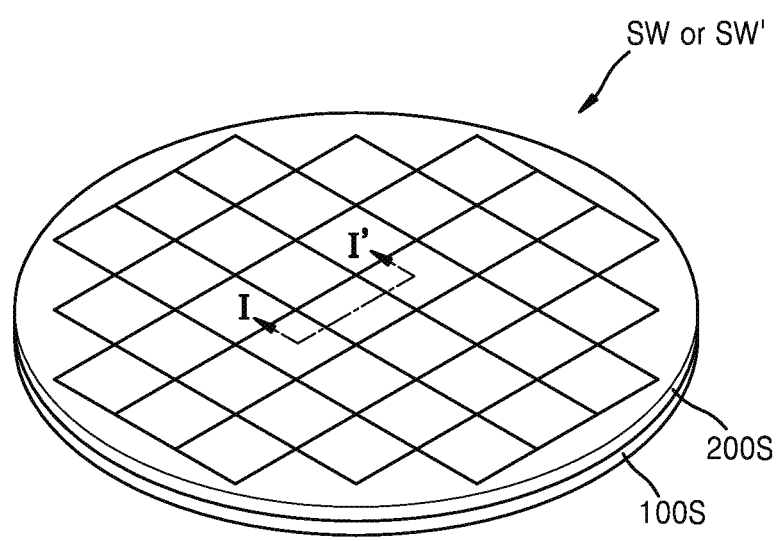
Figure 7B:
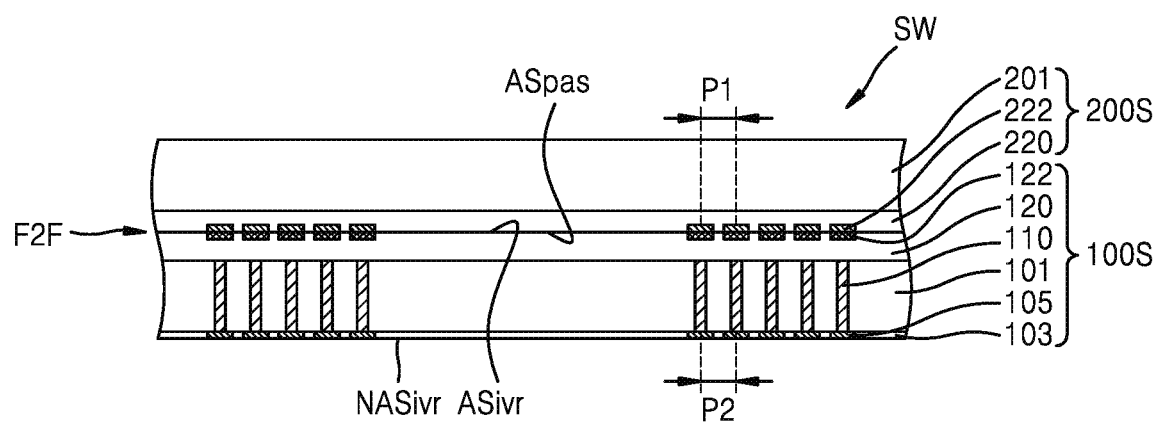
Figure 7C:
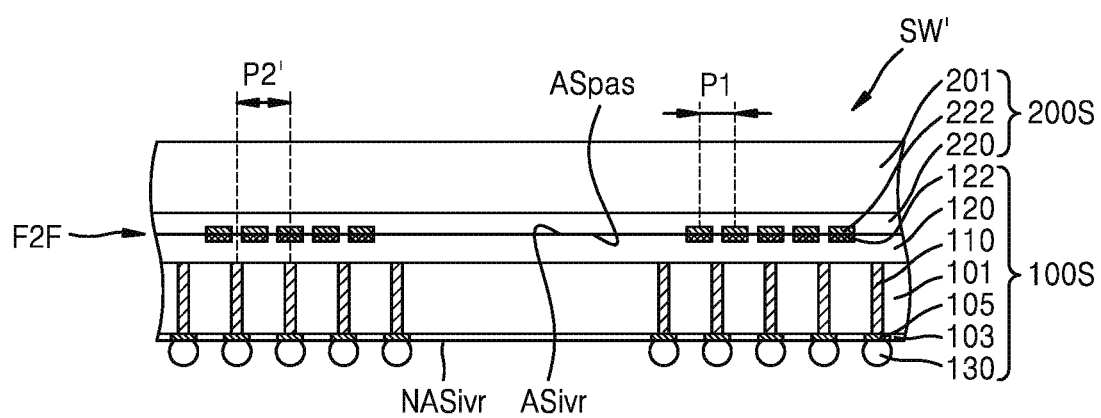
Figure 8A:
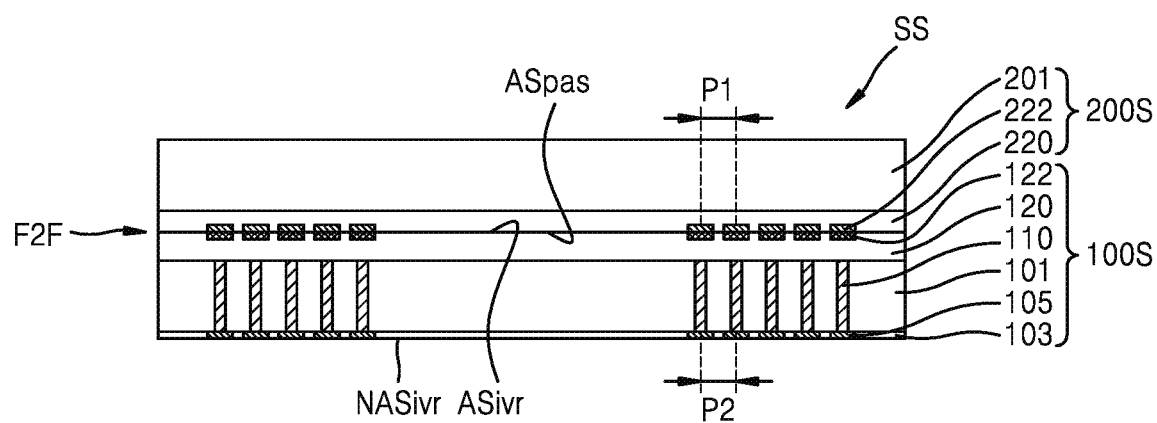
Figure 8B:
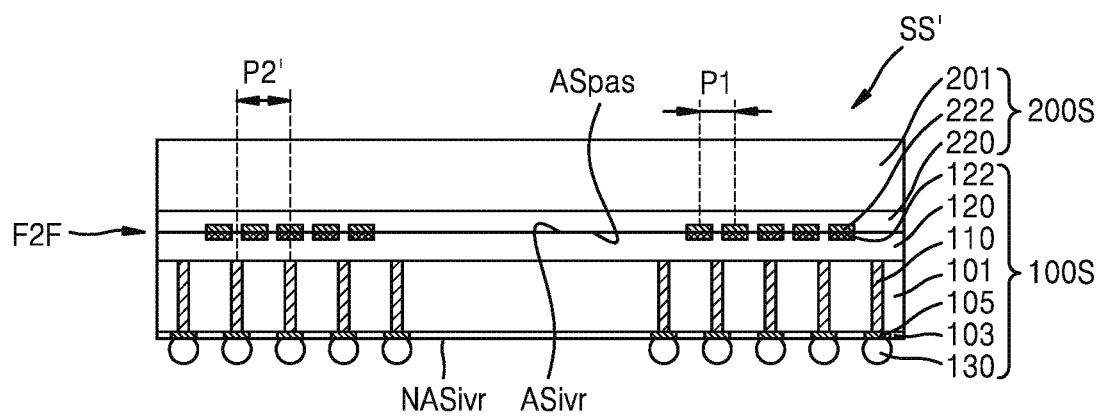

FIGS. 6, 7A-7C, 8A-8B, 9 and 10 are plan views, a perspective view, and cross-sectional views schematically showing a process of a method of manufacturing a semiconductor package of FIG. 1 according to exemplary embodiments. FIGS. 7B and 7C are cross-sectional views taken along line I-I' of FIG. 7A according to exemplary embodiments. FIGS. 8A and 8B correspond to FIGS. 7B and 7C, respectively. A description of FIGS. 6, 7A-7C, 8A-8B, 9 and 10 will be given with reference to FIGS. 1, 2 and 3A to 3C. For convenience of explanation, a further description of elements and technical aspects previously described may be only briefly provided or omitted.

Referring to FIG. 6, in a method of manufacturing a semiconductor package, first, corresponding devices are formed on each of the wafers. For example, voltage regulators may be formed on a first wafer 100S, passive elements (e.g., inductors) may be formed on a second wafer 200S, and logic elements may be formed on a third wafer 300S. In FIG. 6, the solid line rectangles may correspond to chips that are individualized through a subsequent sawing process. For example, the IVR chips 100 may be formed on the first wafer 100S, the passive element chips 200 may be formed on the second wafer 200S, and the logic chips 300 may be formed on the third wafer 300S.

The IVR chips 100, the passive element chips 200, and the logic chips 300 may be substantially the same as the IVR chip 100, the passive element chip 200, and the logic chip 300 of the semiconductor package 1000 of FIG. 1, respectively. However, in an exemplary embodiment, since the IVR chips 100, the passive element chips 200, and the logic chips 300 are in a wafer state in which a bonding process and the sawing process have not yet been performed, a connection member or an ACF is not included. In an exemplary embodiment, the IVR chips 100 and the logic chips 300 in the wafer state may include through-electrodes, and the passive element chips 200 in the wafer state do not include through-electrodes.

Referring to FIGS. 7A to 7C, the second wafer 200S is stacked on the first wafer 100S in a WoW structure to form stack wafer SW or SW'. As seen in FIGS. 7B and 7C, the second wafer 200S may be stacked on the first wafer 100S in a front-to-front bonding form. Furthermore, the second wafer 200S may be stacked on the first wafer 100S through pad-to-pad bonding. Accordingly, the chip pads 122 of the first wafer 100S and the chip pads 222 of the second wafer 200S, which correspond thereto, may contact each other (e.g., directly contact each other).

The stack wafer SW' of FIG. 7C may be different from the stack wafer SW of FIG. 7B in that the connection member 130 is further disposed on the lower surface of the first wafer 100S. For example, the stack wafer SW of FIG. 7B may be a structure when a stack structure (SS of FIG. 8A) formed by sawing is subsequently stacked on the logic chip 300 in a D2 W structure. In contrast, the stack wafer SW' of FIG. 7C may be a structure when a stack structure (SS' of FIG. 8B) formed by sawing is subsequently stacked on the logic chip 300 in a CoW structure. The stack wafer SW' of FIG. 7C may be formed through a bumping process of attaching the connection member 130 on the lower surface of the first wafer 100S after the stack wafer SW of FIG. 7B is formed.

The chip pads 122 of the first wafer 100S and the chip pads 222 of the second wafer 200S may have the first pitch P1. Also, the through-electrodes 110 and the lower pads 105 of the first wafer 100S may have the second pitch P2 or P2'. The second pitch P2 or P2' may be different according to whether a stack structure is stacked in the D2 W structure or the CoW structure on a logic chip, as described above. For example, when the stack structure is stacked in the D2 W structure, the through-electrodes 110 and the lower pads 105 of the first wafer 100S may have the second pitch P2. The second pitch P2 is the same as described with respect to the second pitch P2 of the through-electrodes 110 and the lower pads 105 of the IVR chip 100 in the semiconductor package 1000 or 1000' of FIG. 3A or 3B. When the stack structure is stacked in the CoW structure, the through-electrodes 110 and the lower pads 105 of the first wafer 100S may have the second pitch P2'. The second pitch P2' is the same as described with respect to the second pitch P2' of the through-electrodes 110 and the lower pads 105 of the IVR chip 100 in the semiconductor package 1000" of FIG. 3C.

Referring to FIGS. 8A and 8B, the stack wafers SW and SW' are individualized through a sawing process to form the stack structures SS and SS'. For example, the stack wafer SW of FIG. 7B may be individualized through the sawing process to form the stack structure SS of FIG. 8A, and the stack wafer SW' of FIG. 7C may be individualized through the sawing process to form the stack structure SS' of FIG. 8B. As described above, the through-electrode 110 and the lower pad 105 of the IVR chip 100 of the stack structure SS of FIG. 8A may have the second pitch P2, and the through-electrode 110 and the lower pad 105 of the IVR chip 100 of the stack structure SS' of FIG. 8B may have the second pitch P2'.

Figure 9:
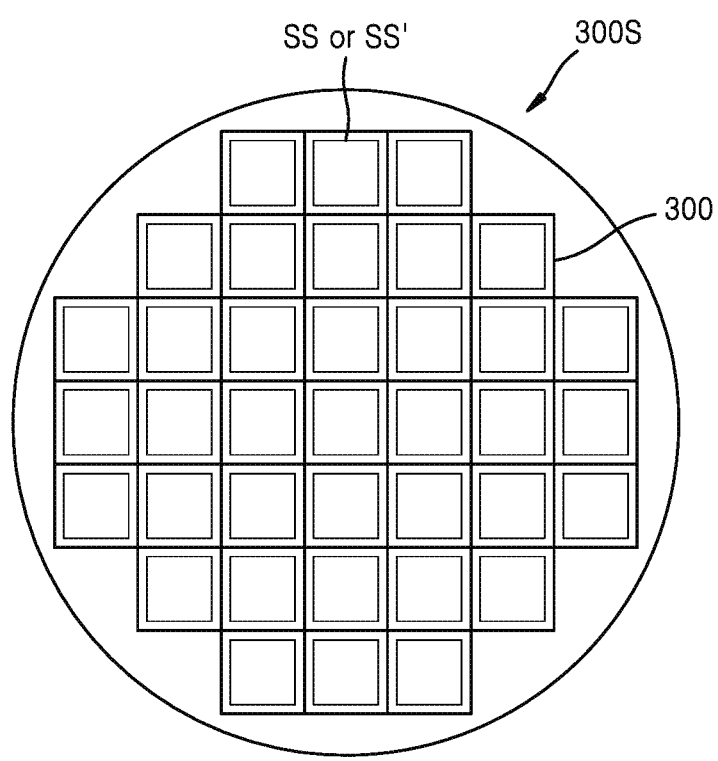

Referring to FIG. 9, each of the stack structures SS or SS' is stacked on the logic chip 300 of the third wafer 300S. For example, the stack structure SS of FIG. 8A may be stacked on the logic chip 300 of the third wafer 300S in the D2 W structure. In addition, the stacking of the stack structure SS of FIG. 8A may use pad-to-pad bonding or bonding using the ACF. In addition, the stacking of the stack structure SS of FIG. 8A may have a front-to-back bonding form in which the inactive surface of the IVR chip 100 of the stack structure SS is bonded onto the active surface of the logic chip 300 as in the semiconductor package 1000 or 1000' of FIG. 3A or 3B. However, according to an exemplary embodiment, the stacking of the stack structure SS of FIG. 8A may have a back-to-back bonding form in which the inactive surface of the IVR chip 100 of the stack structure SS is bonded onto the inactive surface of the logic chip 300.

The stack structure SS' of FIG. 8B may be stacked on the logic chip 300 of the third wafer 300S in the CoW structure. In addition, the stacking of the stack structure SS' of FIG. 8B may use bonding using the connection member 130. In addition, the stacking of the stack structure SS' of FIG. 8B may have a back-to-back bonding form as in the semiconductor package 1000" of FIG. 3C. However, the inventive concept is not limited thereto. For example, according to an exemplary embodiment, the stacking of the stack structure SS of FIG. 8B may have a front-to-back bonding form.

Figure 10:
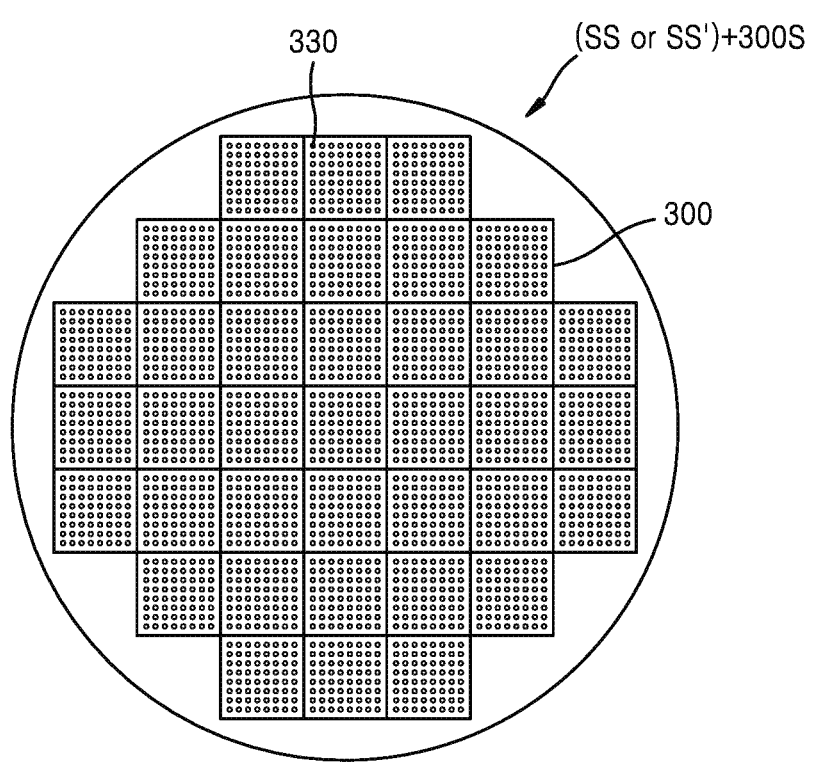

Referring to FIG. 10, after the stack structures SS or SS' are stacked on the logic chips 300, a bumping process of attaching the connection member 330 on the lower surface of the third wafer 300S may be performed. Subsequently, the logic chips 300 and the stack structures SS or SS' are individualized through a sawing process, thereby forming a structure in which the stack structure SS or SS' is stacked on the logic chip 300. Subsequently, the logic chip 300 and the stack structure SS or SS' are stacked on the package substrate 400 using the connection member 330 and the underfill 350 and sealed by the sealing material 500, and thus, the semiconductor package 1000 of FIG. 1 may be manufactured. For example, when the stack structure SS of FIG. 8A is stacked on the logic chip 300, the semiconductor package 1000 or 1000' including the structure shown in FIG. 3A or 3B is manufactured, and when the stack structure SS' of FIG. 8B is stacked on the logic chip 300, the semiconductor package 1000" including the structure shown in FIG. 3C may be manufactured.

Figure 11:
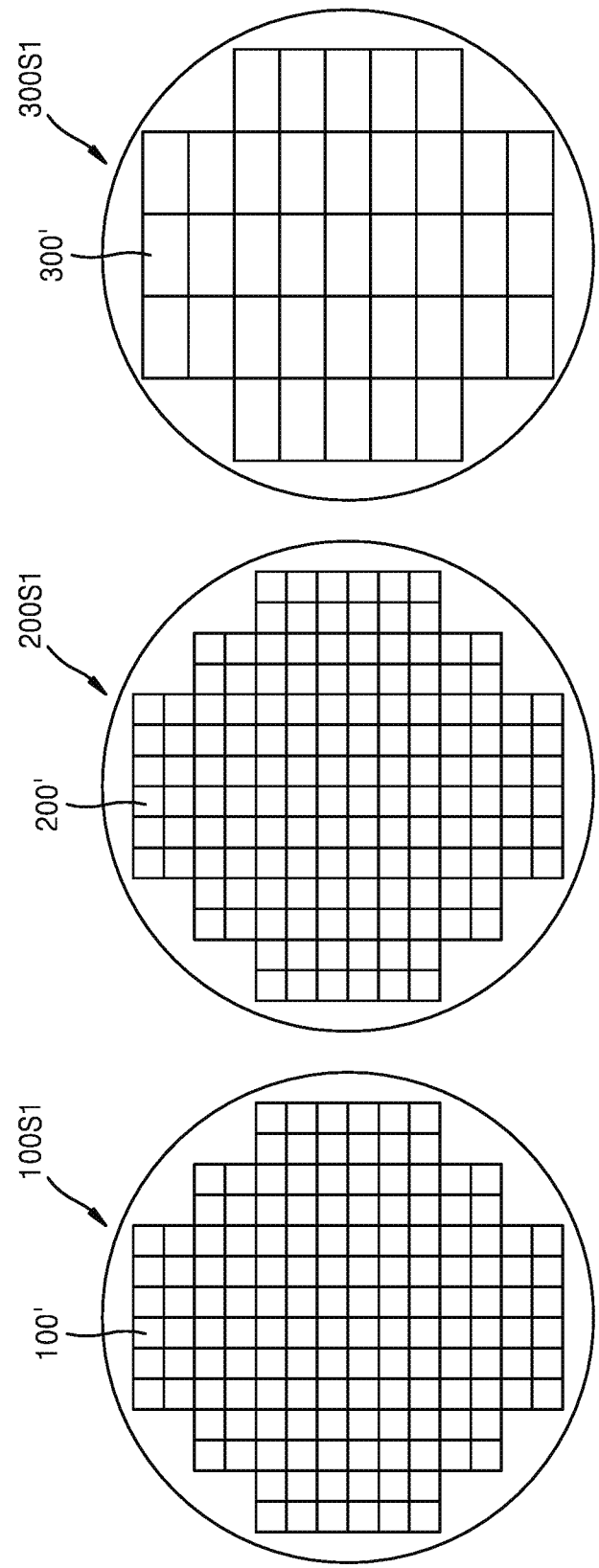
FIGS. 11 and 12 are plan views schematically showing a process of a method of manufacturing the semiconductor package of FIG. 4.
Figure 12:
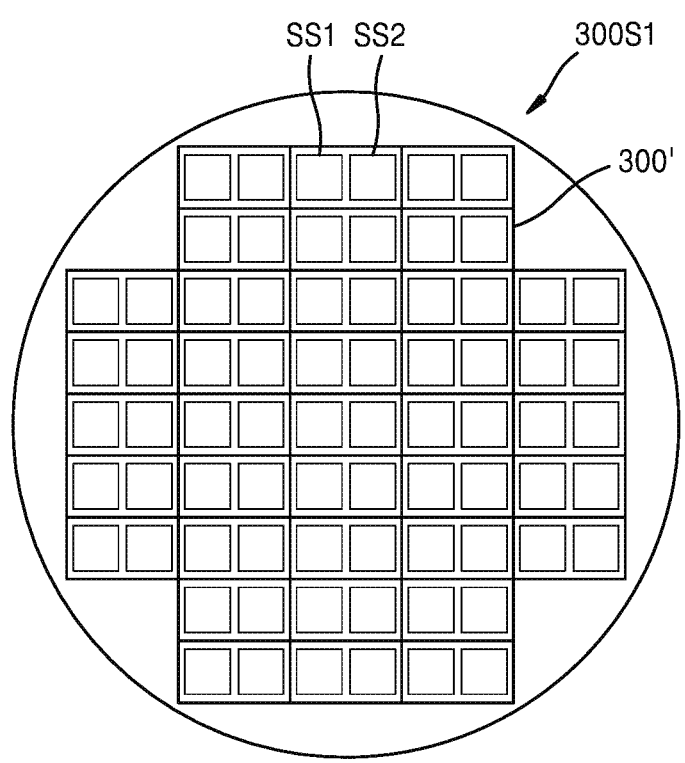

FIGS. 11 and 12 are plan views schematically showing a process of a method of manufacturing the semiconductor package 1000a of FIG. 4. FIGS. 11 and 12 will be described with reference to FIG. 4. For convenience of explanation, a further description of elements and technical aspects previously described may be only briefly provided or omitted.

Referring to FIG. 11, in the method of manufacturing the semiconductor package of an exemplary embodiment, first, corresponding elements are formed on each of a plurality of wafers. For example, voltage regulators may be formed on a first wafer 100S1, passive elements may be formed on a second wafer 200S1, and logic elements may be formed on a third wafer 300S1. In FIG. 11, solid line rectangles may correspond to chips that are individualized through a subsequent sawing process. For example, IVR chips 100' may be formed on the first wafer 100S1, passive element chips 200' may be formed on the second wafer 200S1, and logic chips 300' may be formed on the third wafer 300S1.

In the method of manufacturing the semiconductor package of an exemplary embodiment, the IVR chip 100' of the first wafer 100S1 and the passive element chip 200' of the second wafer 200S1 may have substantially the same size, but the logic chip 300' of the third wafer 300S1 may be larger than the IVR chip 100' and the passive element chip 200'. In addition, as illustrated in FIG. 11, the logic chip 300' may have a long shape in one direction. However, the inventive concept is not limited thereto. For example, according to an exemplary embodiment, the logic chip 300' may also have a square structure similar to the IVR chip 100' and the passive element chip 200', but may have a larger size.

Thereafter, the same process as described with reference to FIGS. 7A to 8B is performed to form the stack structure SS or SS' as shown in FIG. 8A or 8B.

Referring to FIG. 12, each of the stack structures SS or SS' are stacked on the logic chip 300' of the third wafer 300S1, and the stack structures SS or SS are stacked by two on one logic chip 300'. The stack structures SS or SS' may be stacked by two on the logic chip 300' in a D2 W or CoW structure. For example, in the case of the stack structure SS of FIG. 8A, the stack structures SS may be stacked by two on the logic chip 300' in the D2 W structure, and in the case of the stack structure SS' in FIG. 8B, the stack structures SS' may be stacked by two on the logic chip 300' in the CoW structure.

Thereafter, a bumping process of attaching the connection member 330 on the lower surface of the third wafer 300S1 is performed, and a sawing process for individualization is performed, and thus, a structure in which the two stack structures SS or SS' are stacked on one logic chip 300 may be formed. Subsequently, the logic chip 300' and the two stack structures SS or SS' are stacked on the package substrate 400 using the connection member 330 and the underfill 350 and are sealed with a sealing material, and thus, the semiconductor package 1000a of FIG. 4 may be manufactured.

Figure 13A:
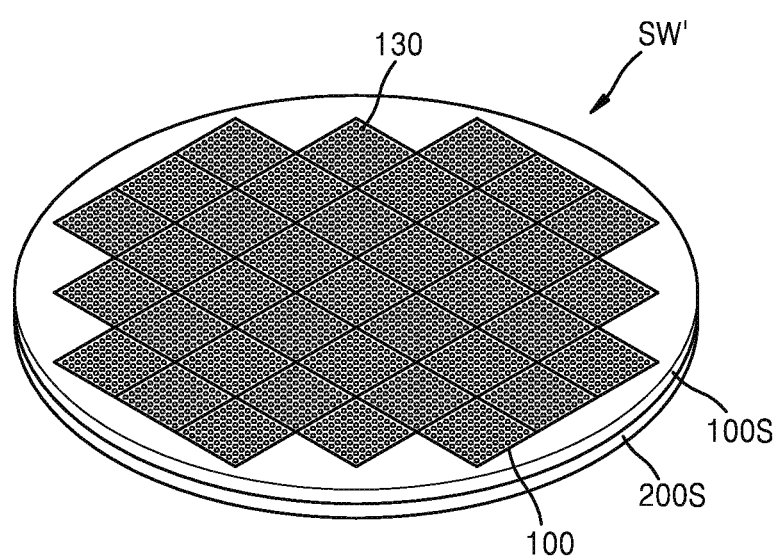
FIGS. 13A and 13B are perspective views schematically showing a process of a method of manufacturing the semiconductor package of FIG. 5.
Figure 13B:
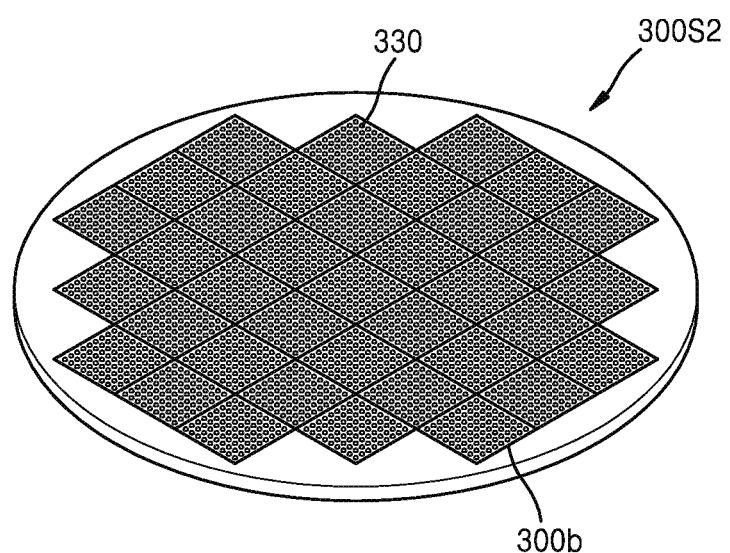

FIGS. 13A and 13B are perspective views schematically showing a process of a method of manufacturing the semiconductor package 1000b of FIG. 5. FIGS. 13A and 13B will be described with reference to FIG. 5. For convenience of explanation, a further description of elements and technical aspects previously described may be only briefly provided or omitted.

Referring to FIGS. 13A and 13B, in the method of manufacturing the semiconductor package of an exemplary embodiment, as shown in FIG. 6, corresponding elements are formed on each of wafers. However, a through-electrode is not formed on a logic chip 300b of a third wafer 300S2. Thereafter, after the stack wafer SW of FIG. 7B is formed, as shown in FIG. 13A, the connection member 130 is attached to the lower surface of the first wafer 100S through a bumping process to form the stack wafer SW' of FIG. 7C. In addition, as illustrated in FIG. 13B, the connection member 330 is attached on the lower surface of the third wafer 300S2 through a bumping process.

Thereafter, the stack wafer SW' and the third wafer 300S2 are individualized through a sawing process to form a stack structure (see SS' in FIG. 8B) and the logic chip 300b. Subsequently, the stack structure SS' and the logic chip 300b are stacked on the package substrate 400 through the connection members 130 and 330 and the underfills 160a and 350, and a sealing material is formed on the package substrate 400, and thus, the semiconductor package 1000b of FIG. 5 may be manufactured.

Figure 14:
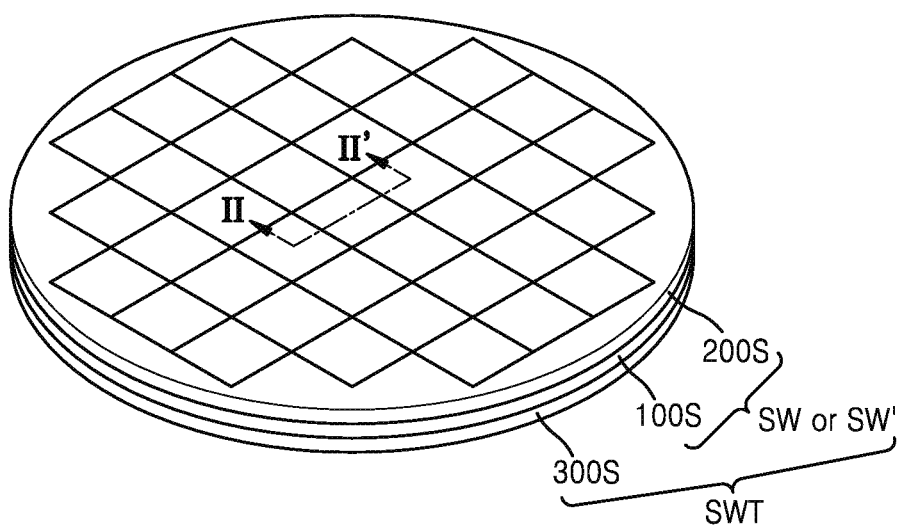
FIGS. 14, 15A-15C and 16 are a perspective view, cross-sectional views, and a plan view schematically showing a process of a method of manufacturing the semiconductor package of FIG. 1 according to exemplary embodiments.
Figure 15A:
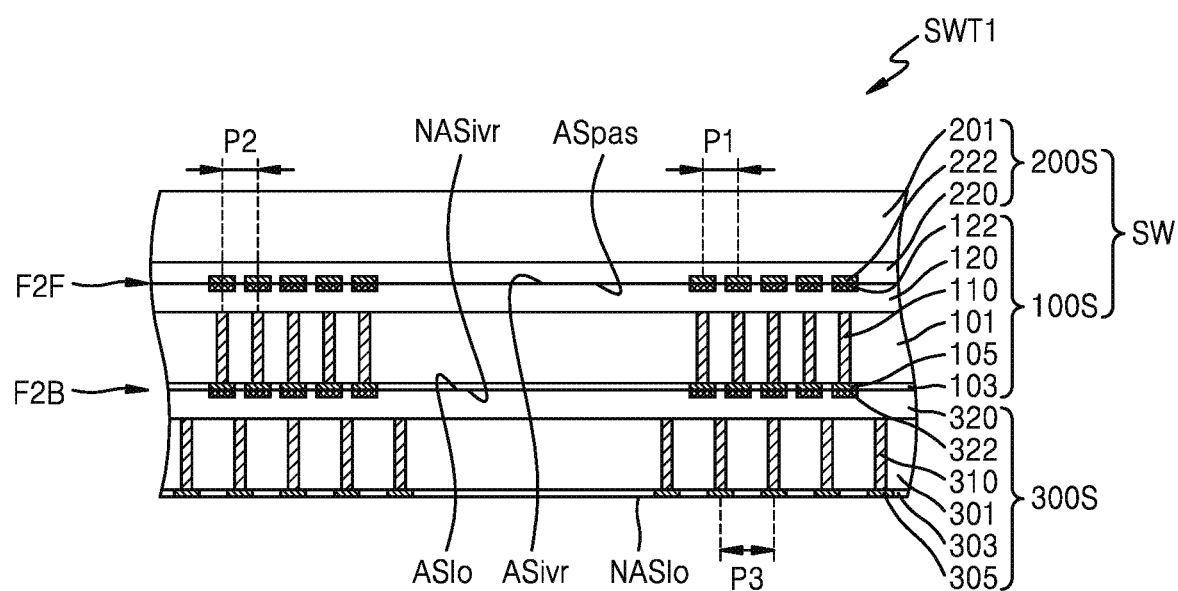
Figure 15B:
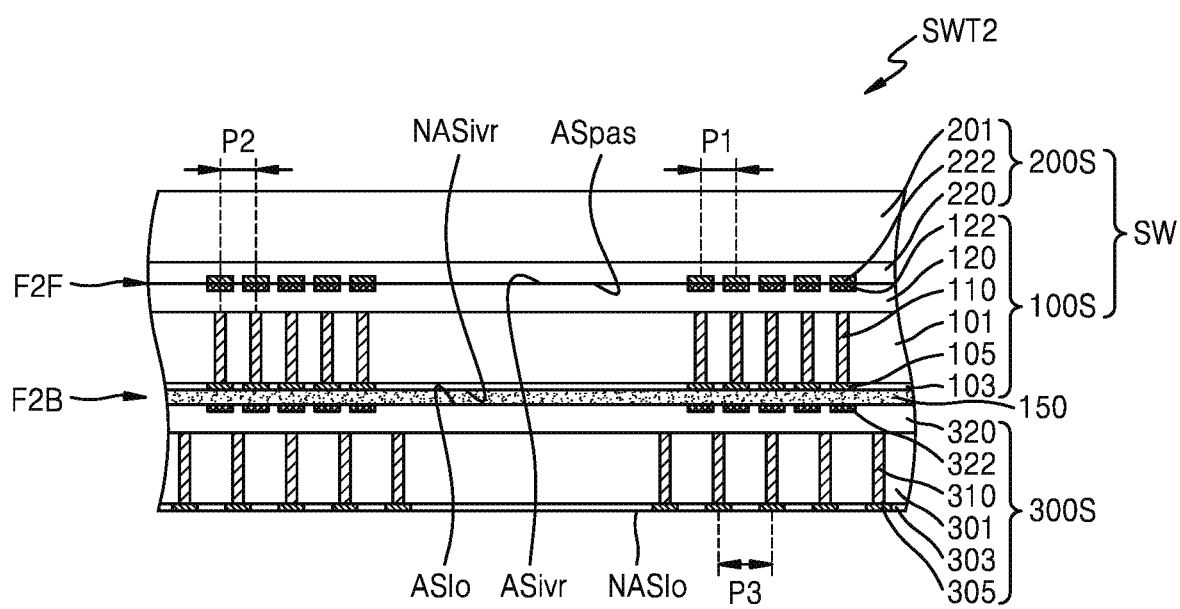
Figure 15C:
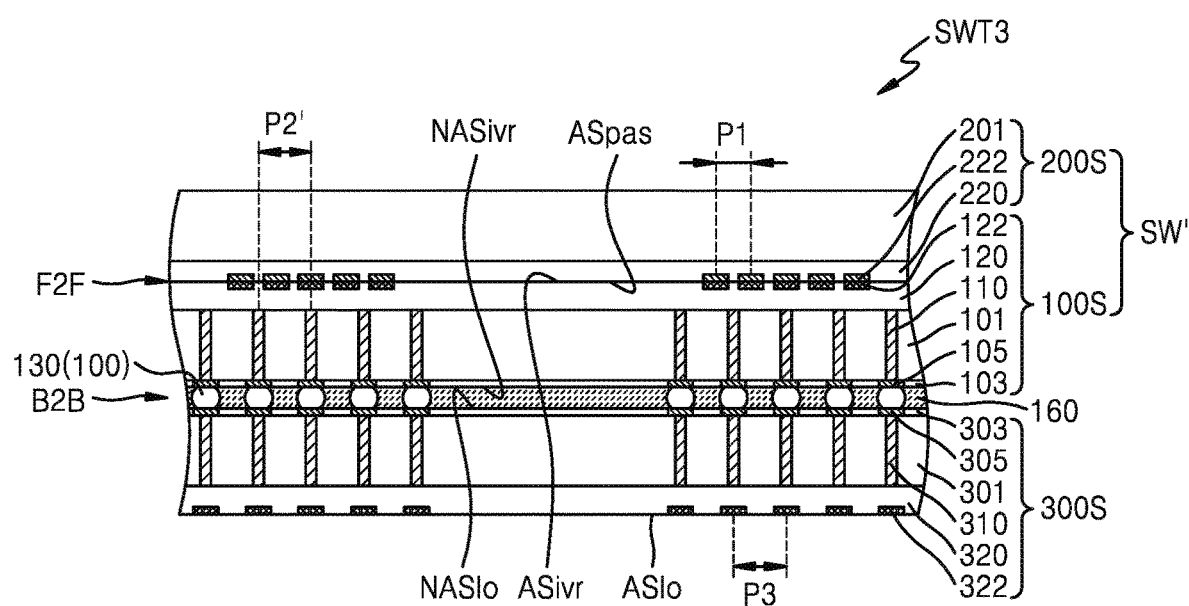

FIGS. 14, 15A-15C and 16 are a perspective view, cross-sectional views, and a plan view schematically showing a process of a method of manufacturing the semiconductor package 1000 of FIG. 1 according to exemplary embodiments. FIGS. 15A to 15C are cross-sectional views taken along line II-II' of FIG. 14. FIGS. 14, 15A-15C and 16 will be described with reference to FIGS. 1 to 3C. For convenience of explanation, a further description of elements and technical aspects previously described may be only briefly provided or omitted.

Referring to FIG. 14, in the method of manufacturing the semiconductor package of an exemplary embodiment, as shown in FIG. 6, corresponding elements are formed on each of a plurality of wafers. Thereafter, the second wafer 200S is stacked on the first wafer 100S in a WoW structure to form the stack wafer SW or SW', and then the stack wafer SW or SW' is stacked on the third wafer 300S in a WoW structure to form a total stack wafer SWT having a three-layer structure. The stacked structure of the total stack wafer SWT may have various structures, as may be seen in FIGS. 15A to 15C and as described below.

Referring to FIG. 15A, in a first total stack wafer SWT1, the stack wafer SW may have a stacked structure in a front-to-front bonding form. In addition, the stack wafer SW may have a stacked structure through pad-to-pad bonding in which the chip pads 122 of the first wafer 100S directly contact the corresponding chip pads 222 of the second wafer 200S. However, the stacked structure of the stack wafer SW is not limited to the stacked structure through pad-to-pad bonding. For example, according to an exemplary embodiment, the stack wafer SW may have a stacked structure through bonding using an ACF.

In the stack wafer SW, the chip pads 122 of the first wafer 100S and the chip pads 222 of the second wafer 200S may have the first pitch P1. Also, the through-electrode 110 and the lower pad 105 of the second wafer 200S may have the second pitch P2. As described below, since the stack wafer SW is stacked on the third wafer 300S through pad-to-pad bonding, the second pitch P2 may be substantially the same as the first pitch P1.

The stack wafer SW may be stacked on the third wafer 300S in a front-to-back bonding form. For example, the stack wafer SW may be stacked on the third wafer 300S in such a way that an inactive surface of the first wafer 100S of the stack wafer SW faces an active surface of the third wafer 300S. Also, the stack wafer SW may be stacked on the third wafer 300S through pad-to-pad bonding. Accordingly, the lower pads 105 of the first wafer 100S of the stack wafer SW may directly contact the corresponding chip pads 322 of the third wafer 300S. The through-electrodes 310 and the lower pads 305 of the third wafer 300S may have the third pitch P3. The first total stack wafer SWT1 may correspond to a structure shown in FIG. 3A after the sawing process.

Referring to FIG. 15B, in a second total stack wafer SWT2, the stack wafer SW may have a stacked structure in front-to-front bonding form and a stacked structure through pad-to-pad bonding. However, according to an exemplary embodiment, the stack wafer SW may have a stacked structure through bonding using an ACF. In the stack wafer SW, the chip pads 122 of the first wafer 100S and the chip pads 222 of the second wafer 200S may have the first pitch P1, and the through-electrode 110 and the lower pad 105 of the second wafer 200S may have the second pitch P2. As described below, since the stack wafer SW is stacked on the third wafer 300S through bonding using the ACF, the second pitch P2 may be substantially the same as the first pitch P1.

The stack wafer SW may be stacked on the third wafer 300S in a front-to-back bonding form. In addition, the stack wafer SW may be stacked on the third wafer 300S through bonding using the ACF 150. Accordingly, the lower pads 105 of the first wafer 100S of the stack wafer SW and the chip pads 322 of the third wafer 300S may be disposed in positions corresponding to each other. The through-electrodes 310 and the lower pads 305 of the third wafer 300S may have the third pitch P3. The second entire stacked wafer SWT2 may correspond to a structure shown in FIG. 3B after the sawing process.

Referring to FIG. 15C, in a third total stack wafer SWT3, the stack wafer SW' may have a stacked structure in front-to-front bonding form and a stacked structure through pad-to-pad bonding. However, according to an exemplary embodiment, the stack wafer SW' may have a stacked structure through bonding using the ACF.

In the stack wafer SW', the chip pads 122 of the first wafer 100S and the chip pads 222 of the second wafer 200S may have the first pitch P1. Also, the through-electrodes 110 and the lower pads 105 of the second wafer 200S may have the second pitch P2'. As described below, since the stack wafer SW' is stacked on the third wafer 300S through bonding using the connection member 130, the second pitch P2' may be greater than the first pitch P1. Before the stack wafer SW' is stacked on the third wafer 300S, the connection member 130 may be attached to the lower surface of the stack wafer SW' through a bumping process.

The stack wafer SW' may be stacked on the third wafer 300S in a back-to-back bonding form. For example, the stack wafer SW' may be stacked on the third wafer 300S in such a way that an inactive surface of the first wafer 100S of the stack wafer SW' faces an inactive surface of the third wafer 300S. An adhesive film 160 may be disposed between the first wafer 100S and the third wafer 300S. In addition, the stack wafer SW' may be stacked on the third wafer 300S through bonding using the connection member 130. Accordingly, the lower pads 105 of the first wafer 100S of the stack wafer SW' may be connected to the corresponding lower pads 305 of the third wafer 300S by using the connection member 130 as a medium. The through-electrodes 310 and the lower pads 305 of the third wafer 300S may have the third pitch P3. The third pitch P3 may be substantially the same as the second pitch P2'. The third total stack wafer SWT3 may correspond to a structure shown in FIG. 3C after the sawing process.

Figure 16:
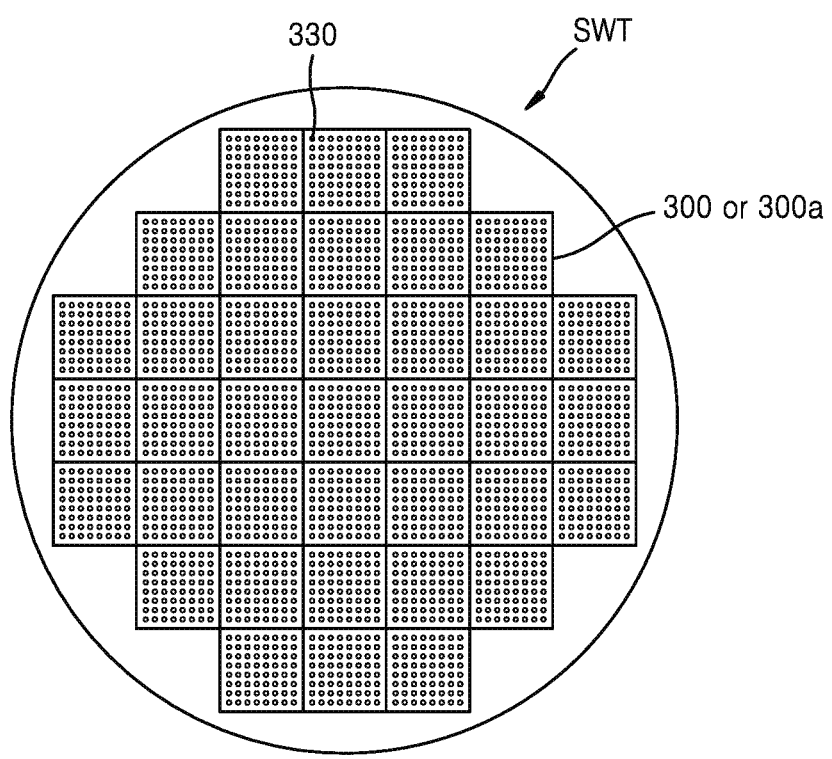

Referring to FIG. 16, after the total stack wafer SWT is formed, the connection member 330 is formed on the lower surface of the third wafer 300S through a bumping process. The lower surface of the third wafer 300S may be different according to whether the total stack wafer SWT has the structure of the first or second total stack wafer SWT1 or SW2, or the structure of the third total stack wafer SWT3. For example, when the total stack wafer SWT has a structure of the first or second total stack wafer SWT1 or SW2, since the stack wafer SW is stacked on the third wafer 300S in a front-to-back bonding form, the connection member 330 may be attached on an inactive surface of the third wafer 300S. When the total stack wafer SWT has a structure of the third total stack wafer SWT3, since the stack wafer SW' is stacked on the third wafer 300S in a back-to-back bonding form, the connection member 330 may be attached on an active surface of the third wafer 300S.

Thereafter, the total stack wafer SWT is individualized through a sawing process to form a three-layer stacked structure of the logic chip 300 or 300a and the stack structure SS. The three-layer stacked structure may correspond to, for example, the structures shown in FIGS. 3A to 3C. Subsequently, the three-layer stacked structure is stacked on the package substrate 400 through the connection member 330 and the underfill 350 and a sealing material is formed on the package substrate 400, and thus, the semiconductor package 1000 of FIG. 1 may be manufactured.

While the inventive concept has been particularly shown and described with reference to the exemplary embodiments thereof, it will be understood by those of ordinary skill in the art that various changes in form and detail may be made therein without departing from the spirit and scope of the inventive concept as defined by the following claims.

What is claimed is:

1. A semiconductor package, comprising:
   a package substrate;
   a logic chip stacked on the package substrate and comprising at least one logic element; and
   a stack structure comprising an integrated voltage regulator (IVR) chip and a passive element chip stacked on the IVR chip,
   wherein the stack structure is disposed on the package substrate adjacent to the logic chip.

2. The semiconductor package of claim 1, wherein, in the stack structure, the passive element chip is stacked on the IVR chip in a front-to-front bonding form in which an active surface of the passive element chip and an active surface of the IVR chip face each other.

3. The semiconductor package of claim 2, wherein the front-to-front bonding form is implemented using pad-to-pad bonding in which copper pads are bonded to one another.

4. The semiconductor package of claim 2, wherein the front-to-front bonding form is implemented using an anisotropic conductive film (ACF).

5. The semiconductor package of claim 2, wherein a pitch between pads of the passive element chip or the IVR chip is about 10 um or less.

6. The semiconductor package of claim 1, wherein the IVR chip comprises a through-electrode, and
   a lower surface of the IVR chip is an inactive surface and an upper surface of the IVR chip is an active surface.

7. The semiconductor package of claim 6, wherein a lower surface of the passive element chip is an inactive surface, and
   the passive element chip is stacked on the IVR chip using pad-to-pad bonding or an anisotropic conductive film (ACF).

8. The semiconductor package of claim 1, wherein the IVR chip comprises a voltage regulating circuit that regulates a voltage of the at least one logic element, and
   the passive element chip comprises an inductor.

9. The semiconductor package of claim 1, wherein the logic chip comprises a plurality of logic elements using at least two different voltages.

10. The semiconductor package of claim 1, wherein the logic chip and the stack structure are respectively stacked on the package substrate using a connection member.

11. A semiconductor package, comprising:
    a package substrate;
    a logic chip stacked on the package substrate and comprising at least one logic element; and
    a stack structure stacked on the package substrate adjacent to the logic chip, wherein the stack structure comprises:
an integrated voltage regulator (IVR) chip comprising a voltage regulating circuit that regulates a voltage of the at least one logic element; and
a passive element chip stacked on the IVR chip and comprising an inductor,
wherein the passive element chip is stacked on the IVR chip in a front-to-front bonding form.

12. The semiconductor package of claim 11, wherein the front-to-front bonding form is implemented using pad-to-pad bonding in which copper pads are bonded to one another.

13. The semiconductor package of claim 11, wherein the IVR chip comprises a through-electrode, and
a lower surface of the IVR chip is an inactive surface and an upper surface of the IVR chip is an active surface.

14. The semiconductor package of claim 13, wherein a lower surface of the passive element chip is an active surface and faces the IVR chip.

15. The semiconductor package of claim 11, wherein the logic chip comprises a plurality of logic elements using at least two different voltages.

16. A semiconductor package, comprising:
a package substrate;
a logic chip mounted on the package substrate and comprising at least one logic element;
an integrated voltage regulator (IVR) chip stacked on the package substrate adjacent to the logic chip and comprising a voltage regulating circuit that adjusts a voltage of the at least one logic element; and
a passive element chip stacked on the IVR chip and comprising an inductor,
wherein the passive element chip is stacked on the IVR chip in a front-to-front bonding form in which an active surface of the passive element chip and an active surface of the IVR chip face each other,
wherein a pitch between pads of the passive element chip or the IVR chip is about 10 um or less.

17. The semiconductor package of claim 16, wherein the IVR chip comprises a through-electrode,
an upper surface of the IVR chip is an active surface, and
a lower surface of the passive element chip is an active surface and faces the IVR chip.

18. The semiconductor package of claim 16, wherein the front-to-back bonding form is implemented using pad-to-pad bonding or bonding using an anisotropic conductive film (ACF).

19. The semiconductor package of claim 16, wherein the IVR chip is stacked on the package substrate using connection members, and a pitch between the connection members is about 50 um or less.

20. The semiconductor package of claim 16, wherein the logic chip comprises a plurality of logic elements using at least two different voltages, and
the voltage regulating circuit regulates the at least two different voltages.

* * * * *